(12) United States Patent
Yeh et al.

(10) Patent No.: US 10,741,646 B2
(45) Date of Patent: *Aug. 11, 2020

(54) FIELD-EFFECT TRANSISTORS HAVING CONTACTS TO 2D MATERIAL ACTIVE REGION

(71) Applicant: Taiwan Semiconductor Manufacturing Co., Ltd., Hsinchu (TW)

(72) Inventors: Ling-Yen Yeh, Hsinchu (TW); Yee-Chia Yeo, Hsinchu (TW); Chi-Wen Liu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/404,289

(22) Filed: May 6, 2019

(65) Prior Publication Data
US 2019/0326399 A1 Oct. 24, 2019

Related U.S. Application Data

(63) Continuation of application No. 15/203,674, filed on Jul. 6, 2016, now Pat. No. 10,283,590.

(51) Int. Cl.
*H01L 29/10* (2006.01)
*H01L 29/778* (2006.01)
(Continued)

(52) U.S. Cl.
CPC ...... *H01L 29/1033* (2013.01); *H01L 27/0886* (2013.01); *H01L 29/0657* (2013.01);
(Continued)

(58) Field of Classification Search
CPC ............ H01L 29/1033; H01L 29/0847; H01L 29/1054; H01L 29/66795; H01L 27/0886;
(Continued)

(56) References Cited

U.S. PATENT DOCUMENTS 6,136,654 A 10/2000 Kraft et al.
2007/0001219 A1* 1/2007 Radosavljevic .. H01L 29/41791
257/327

(Continued)

OTHER PUBLICATIONS

J. Kedzierski, P. Xuan, V. Subramanian, J. Bokor, T.-J. King, and C. Hu, "A 20 nm gate length ultra-thin body p-MOSFET with silicide source drain," Superlattices and Microstructures, vol. 28, No. 5/6, pp. 445, 2000.

(Continued)

*Primary Examiner* — Dale E Page
*Assistant Examiner* — Quovaunda Jefferson
(74) *Attorney, Agent, or Firm* — Haynes and Boone, LLP

(57) ABSTRACT

Exemplary FET devices having 2D material layer active regions and methods of fabricating thereof are described. For example, a black phosphorus active region has a first thickness in the channel region and a second, greater, thickness in the source/drain (S/D) region. The BP in the S/D region has a sidewall that interfaces a contact disposed over the FET. A gate electrode is disposed over the channel region. In some embodiments, the sidewall has passivated edge. In some embodiments, the sidewall is nonlinear. In some embodiments, the stress layer is disposed over the 2D material layer.

20 Claims, 24 Drawing Sheets

(51) Int. Cl.
*H01L 29/423* (2006.01)
*H01L 29/66* (2006.01)
*H01L 29/06* (2006.01)
*H01L 29/24* (2006.01)
*H01L 27/088* (2006.01)
*H01L 29/08* (2006.01)
*H01L 29/78* (2006.01)

(52) U.S. Cl.
CPC ...... *H01L 29/0847* (2013.01); *H01L 29/1054* (2013.01); *H01L 29/24* (2013.01); *H01L 29/4236* (2013.01); *H01L 29/66795* (2013.01); *H01L 29/66969* (2013.01); *H01L 29/778* (2013.01); *H01L 29/785* (2013.01)

(58) Field of Classification Search
CPC ............... H01L 29/778; H01L 29/4236; H01L 29/66969; H01L 29/0657; H01L 29/24; H01L 29/785
See application file for complete search history.

(56) References Cited

U.S. PATENT DOCUMENTS

| | | |
|---|---|---|
| 2008/0312088 A1 | 12/2008 | Chung et al. |
| 2011/0309334 A1 | 12/2011 | Chang et al. |
| 2012/0058350 A1 | 3/2012 | Long et al. |
| 2013/0309776 A1 | 11/2013 | Drndic et al. |
| 2014/0353591 A1 | 12/2014 | Kim et al. |
| 2015/0102807 A1 | 4/2015 | Eckinger et al. |
| 2015/0236147 A1 | 8/2015 | Chu et al. |

OTHER PUBLICATIONS

T.-Y. Liow, K.-M. Tan, R. T. P. Lee, M. Zhu, B. L.-H. Tan, N. Balasubramanian, and Y.-C. Yeo, "Germanium source and drain stressors for ultrathin-body and nanowire field-effect transistors," IEEE Electron Device Letters, vol. 29, No. 7, pp. 808, 2008.

T. Low, M. F. Li, W. J. Fan, S. T. Ng, Y.-C. Yeo, C. Zhu, A. Chin, L. Chan, and D.-L. Kwong, "Impact of surface roughness on silicon and germanium ultra-thin-body MOSFETs," IEEE International Electron Device Meeting 2004, pp. 151.

M. Poljak, V. Jovanovic, D. Grgec, and T. Suligoj, "Assessment of electron mobility in ultrathin-body InGaAs-on-insulator MOSFETs using physics-based modeling," IEEE Transactions on Electron Devices, vol. 59, No. 6, pp. 1636, 2012.

L. Li, Y. Yu, G. J. Ye, Q. Ge, X. Ou, H. Wu, D. Feng, X. H. Chen, and Y. Zhang, "Black phosphorus field-effect transistors," Nature Nanotechnology, vol. 9, 372, May 2014.

J. QIao, X. Kong, Z.-X. Hu, F. Yang, and W. Ji, "High-mobility transport anisotropy and dichroism in few-layer black phosphorus," Nature Communications, vol. 5, 4475, Jul. 2014.

H. Wang, X. Wang, F. Xia, L. Wang, H. Jiang, Q. Xia, M. L. Chin, M. Dubey, and Shu-J. Han, "Black phosphorus radio-frequency transistors," Nano Letters, vol. 14, pp. 6424, 2014.

L. Cartz, S. R. Srinivasa, R. J. Riedner, J. D. Jorgensen, and T. G. Worlton, "Effect of pressure on bonding in black phosphorus," J. Chemical Physics, vol. 71, 1718, 1979.

S.-L. Yau, T. P. Moffat, A. J. Bard, Z. Zhang, and M. M. Lerner, "STM of the (010) surface of orthorhombic phosphorus," Chemical Physics Letters, vol. 198, No. 3-4, pp. 393, 1992.

J. O. Island, G. A. Steele, H. S. J. van der Zant, and A. Castellanos-Gomez, "Environmetal stability of few-layer black phosphorus," 2D Materials, vol. 2, No. 1, 011002, 2015.

M. Kopf, N. Eckstein, D. Pfister, C. Grotz, I. Kruger, M. Greiwe, T. Hansen, H. Kohlmann, and T. Nilges, "Access and in situ growth of phosphorene-precursor black phosphorus," Journal of Crystal Growth, vol. 405, pp. 6-10, 2014.

P. W. Bridgman, J. Am. Chem. Soc., vol. 36, 1344, 1914.

R. W. Keyes, "The electrical properties of black phosphorus," Physical Review, vol. 92, pp. 580, 1953.

A. Morita, "Semiconducting black phosphorus," Appl. Phys. A, vol. 39, pp. 227-242, 1988.

\* cited by examiner

FIELD-EFFECT TRANSISTORS HAVING CONTACTS TO 2D MATERIAL ACTIVE REGION

PRIORITY

This application is a continuation application of U.S. patent application Ser. No. 15/203,674, filed Jul. 6, 2016, entitled "FIELD-EFFECT TRANSISTORS HAVING CONTACTS TO 2D MATERIAL ACTIVE REGION," hereby incorporated by reference herein.

BACKGROUND

A metal-oxide-semiconductor field-effect transistor (MOSFET), or simply a field-effect transistor (FET) or a transistor, is widely used in integrated circuits (ICs), including digital integrated circuits, radio frequency (RF) analog circuits, etc. The gate length of a transistor is reduced or scaled down to increase the packing density of transistors in an IC and to increase the speed performance thereof. However, transistors with aggressively miniaturized gate lengths suffer from undesirable short-channel effects, such as increased off-state leakage current.

One way to address suppressing short-channel effects is to employ a semiconducting channel with reduced thickness, referred to as an ultra-thin body transistor. Ultra-thin body transistors may employ ultra-thin channel materials. 2D materials, also referred to as few-layer materials, are crystalline materials of a few layers of atoms that are promising candidates for use for thin channel materials. One type of 2D material with high mobility is black phosphorus (BP). BP is a layered material; a monolayer of BP termed "phosphorene". BP is a semiconductor with a direct band gap ranging from about 1.5 eV of a monolayer to 0.59 eV of a five-layer stack at the Γ point of the first Brillouin zone.

Existing transistors and methods of fabricating transistors with a BP, or other 2D materials, channel can have undesirable contact resistance which limits their performance. For example, some methods can provide radio frequency (RF) transistors using BP as a channel material can exhibit current gain, cutoff frequency ($f_T$) and maximum oscillation frequency ($f_{max}$) that are lower than desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
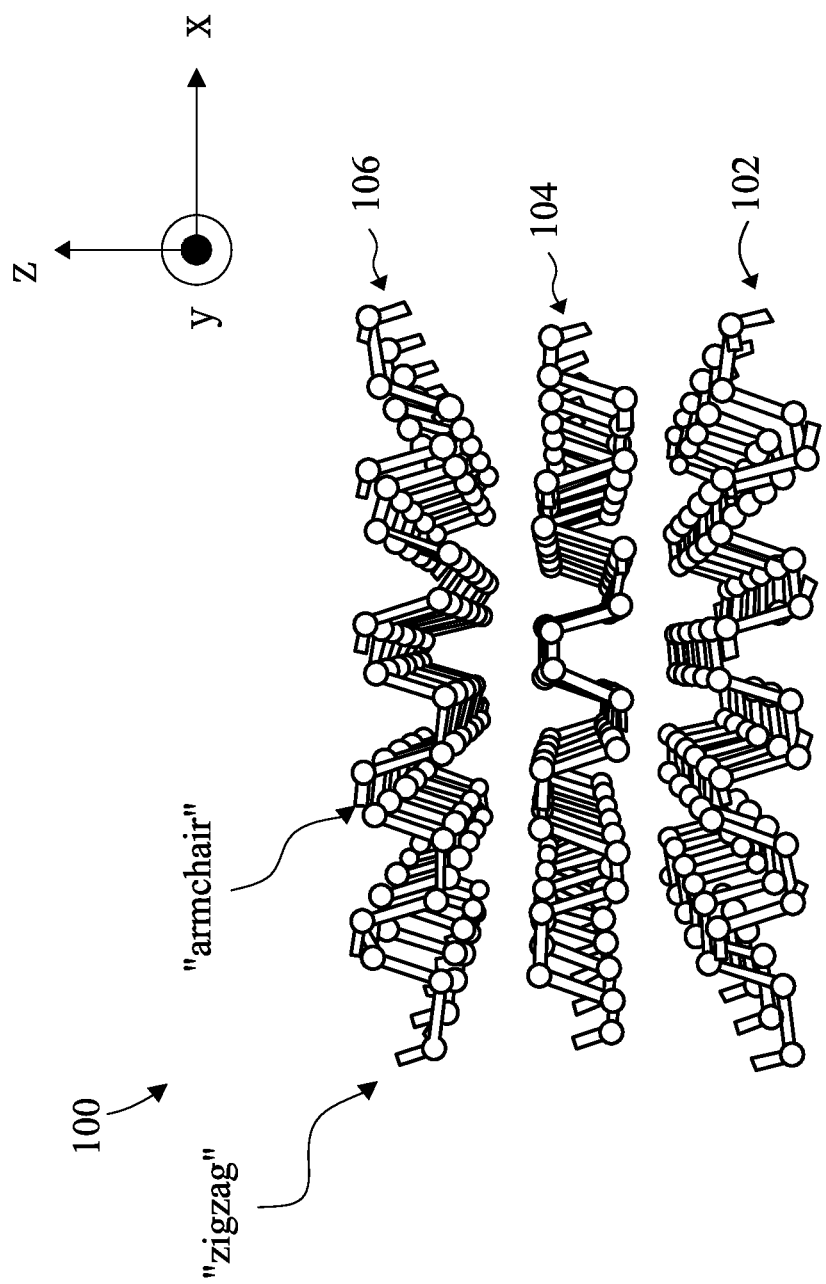
FIG. 1A is a perspective view of a plurality of BP layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, it is related to semiconductor devices such as field effect transistors (FETs) having an active region including 2D material, including as a channel layer. One type of 2D material discussed herein is black phosphorus (BP). However, embodiments of the present disclosure also apply to other types of 2D materials such as, graphene, molybdenum disulfide, and/or other 2D materials, now known or later developed, and including combinations of 2D materials. The term "BP layer" as used herein refers to one layer of phosphorene or multiple layers of phosphorene. A "single BP layer" references to one monolayer of phosphorene. Similarly, a "2D material monolayer" or "single 2D layer" refers to one atomic layer of a 2D material(s); a "2D layer" refers generally to one or more atomic layers of the 2D material.

Figure 1B:
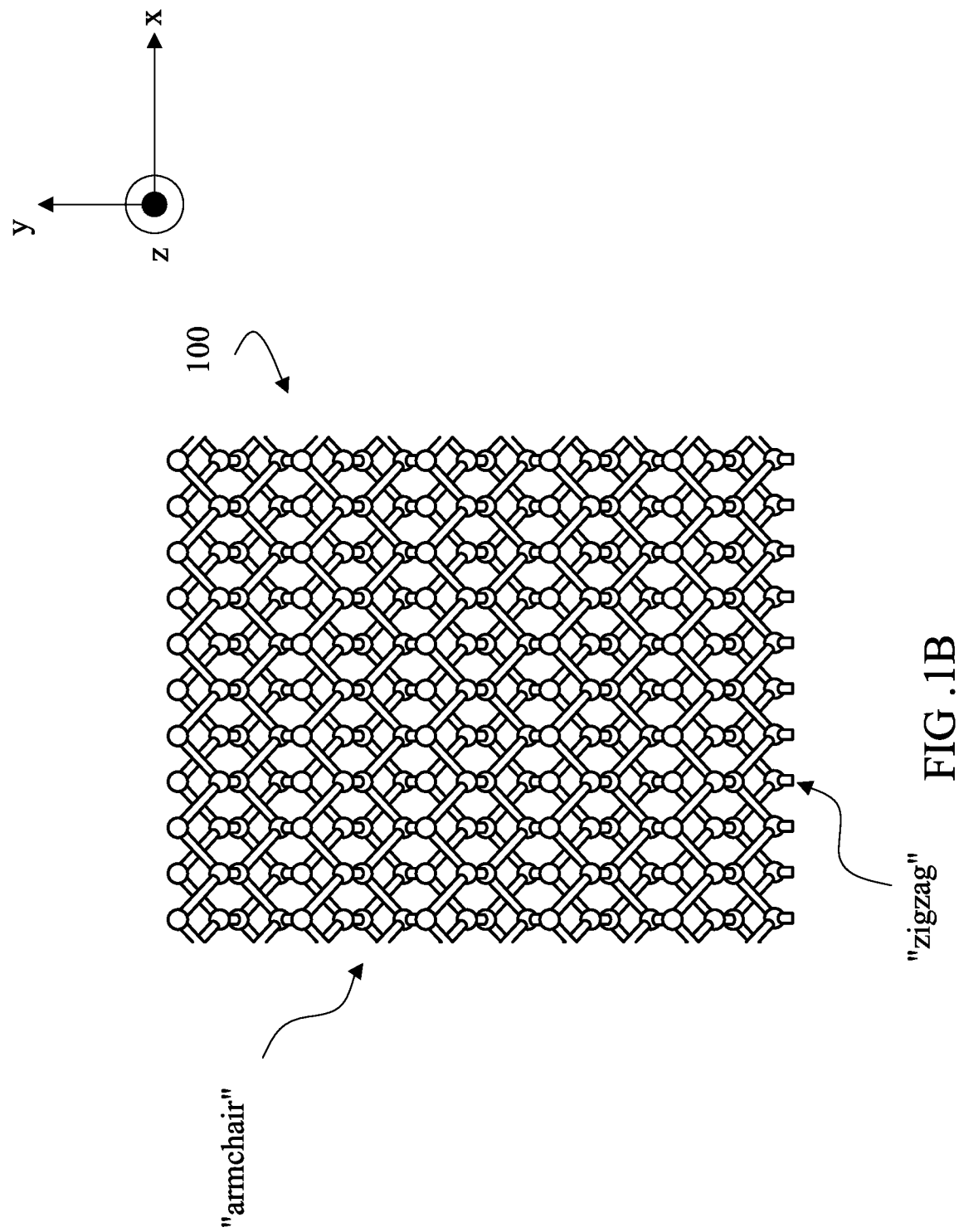
FIG. 1B is a top view of a plurality of BP layers.

FIG. 1A illustrates a perspective view illustrating the atomic structure of black phosphorous (BP) 100 including three layers 102, 104, 106. FIG. 1B illustrates a top view of the BP 100. Each layer 102, 104, and 106 is a layer of phosphorene having covalently bonded, crystalline allotrope of phosphorus. As illustrated, the crystalline structure of the phosphorene is a puckered layer in which phosphorous atoms are located on two parallel planes. The BP 100 of FIG. 1A illustrates a gap between monolayers, which is provided for ease of understanding only and not intended to imply any specific distance of separation therebetween, but representing a weak interlayer Van der Waals attraction. This weak interlayer interaction provides for suitable mechanical or chemical separation into individual layers to provide the thickness variations in a region as discussed below. In an embodiment, the period (or spacing) between two layers of phosphorene is about 0.53 nm. The BP 100 has a finite bandgap.

As illustrated in FIG. 1A, the x-direction corresponds to the direction in the 2-D plane perpendicular to the "ridges" of each layer 102, 104, 106. The y-direction corresponds to the direction in the 2-D plane parallel to the "ridges" of each layer 102, 104, 106. The BP 100 (and the layers that comprise it) has an edge state defined by an edge cut in each of the x-direction and the y-direction; this edge state is also referred to herein as the terminal edge. There is a first terminal edge for a cut in the x-direction of each layer 102, 104, 106 of the BP 100; this terminal edge may be referred to as an "armchair edge." At the "armchair edge," the edge may be semiconducting. The terminal edge for a cut in the y-direction of each layer 102, 104, 106 of the BP 100 provides for an edge state is referred to as a "zigzag atomic configuration" or "zigzag edge." The terminal edge in the y-direction may provide metallic properties.

Figure 2:
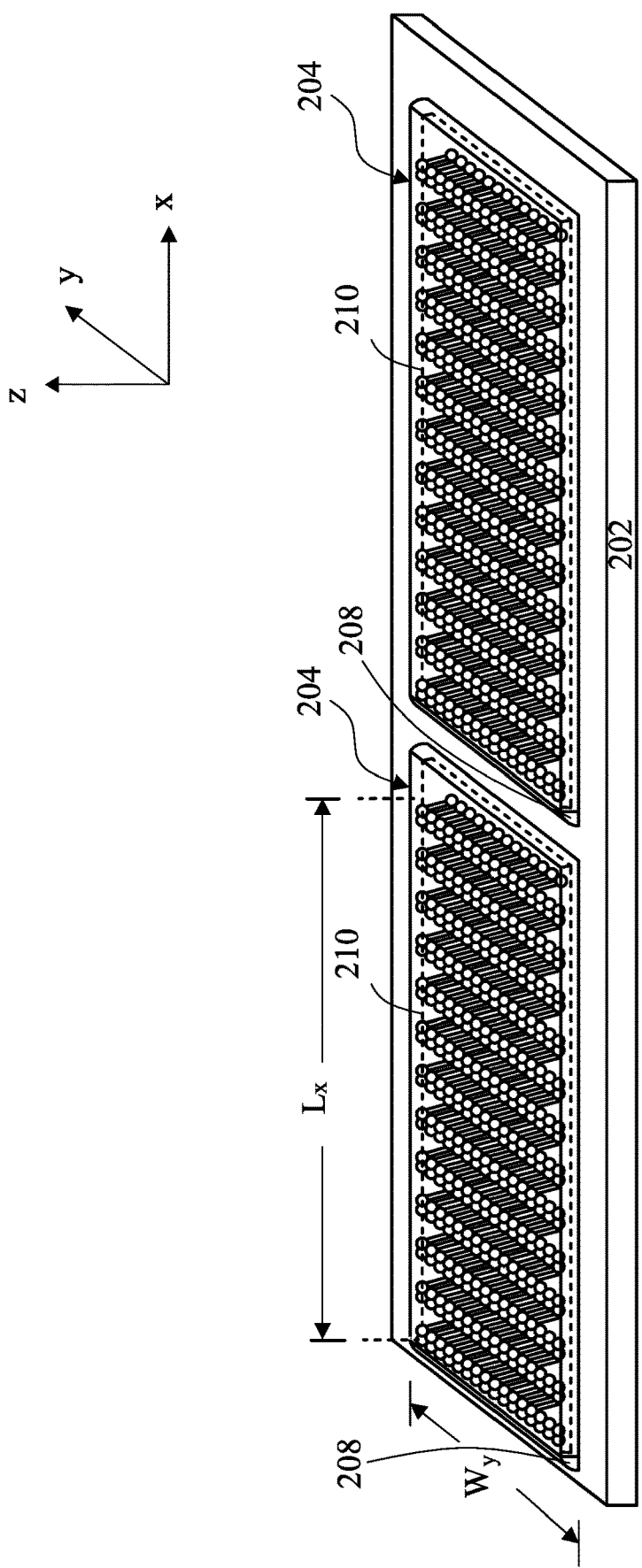
FIG. 2 is a perspective view of an embodiment of active regions of BP layer(s) formed on a substrate according to various aspects of the present disclosure.

FIG. 2 is illustrative of an insulating layer 202 having two active regions 204 disposed thereon. Each active region 204 comprises a 2D material. In an embodiment, each active region 204 includes at least one BP layer. The 2D material forming the active regions 204 may be substantially similar to one or more of layers 102, 104, or 106 of the BP 100, described above. The insulating layer 202 and the active regions 204 may be disposed on a substrate suitable for fabrication of a semiconductor device. In an embodiment, the insulating layer 202 comprises silicon oxide, aluminum oxide, and/or other suitable compositions including, for example, amorphous dielectric materials. In an embodiment, the insulating layer 202 provides a planar top surface. In an embodiment, the insulating layer 202 provides for or is formed upon a topography such as fin elements. See for example, FIGS. 19A and 19B.

Similar to BP 100 of FIGS. 1A, 1B, the atomic configuration of the 2D material forming the active regions 204 is a puckered structure. The x-direction refers to the direction in the 2-D plane perpendicular to the ridges; the y-direction refers to the direction in the 2-D plane parallel to the ridges. FIG. 2 illustrates that a cutline along the x-direction and defines a terminal edge along the x-direction of the active region 204 that is an "armchair" edge. A cutline along the y-direction and defining a terminal edge along the y-direction of the active region 204 that is a "zigzag" edge.

The active regions 204, like the BP 100 above, are anisotropic in their carrier transport characteristics. In other words, the carrier mobility is greater in the x-direction of the active regions 204 (as it is with the x-direction of FIGS. 1A, 1B). Thus, to provide desired carrier transport characteristics, a gate structure may be disposed on the active region 204 such that a gate length is defined in the x-direction and a gate width is defined in the y-direction. The active region 204 provides an available length Lx and an available width Wy. In other words, the orientation of the source-to-drain direction of a transistor to be formed on the active region 204 is in the direction of the light effective mass of the phosphorene (the "x" direction). In an embodiment, the effective mass for electrons/holes in about 0.3 $m_0$ taking free electron mass $m_0$ as a reference in the x-direction. In an embodiment, the effective mass for electrons is about 8.3 $m_0$ and is about 2.6 $m_0$ for holes in the y-direction.

The active regions 204 include 2D material which may be formed by various techniques. The following provides exemplary discussion of forming a 2D material of black phosphorus for the active regions 204. However, this description is exemplary only and not intended to be limiting beyond what is specifically claimed. As one example, orthorhombic black phosphorus can be grown by a short-way transport reaction from red phosphorus and tin/tin-iodide as a mineralization additive. In another example, black phosphorus can be synthesized from white phosphorus under high pressure (e.g., about 13,000 kg/cm$^2$) at a temperature (e.g., about 200 degrees Celsius). The thickness of the 2D material of the active region 204 can be controlled by the deposition time. In embodiments, the thickness of the active region 204 may range from 1 monolayer to 20 monolayers. As discussed below, the thickness of the active region in some embodiments may be varied between different regions (e.g., channel region and source/drain (S/D) region). In some embodiments, the thickness of the active region is continuous.

In some embodiments, the thickness of the active region 204 is between approximately 1 monolayer and about 20 monolayers of phosphorene (about 10.6 nm in thickness); in a further embodiment, the thickness of the active region 204 is between approximately 1 monolayer and 10 monolayers (about 5.3 nm in thickness). In an embodiment, the period of multiple layers of phosphorene in the active region 204 is about 0.53 nm.

Multiple active regions 204 may be spaced apart from each other on a substrate and/or insulating layer 202. In some embodiments, the active regions may be spaced apart by less than approximately 20 nanometers (nm), such as less than approximately 5 nm. Exemplary dimensions for the length $L_x$ in the "x" direction range from approximately 10 nm to more than 1000 micrometers, in a further embodiment, Lx is between approximately 20 nm and approximately 100 nm. The width $W_y$ in the "y" direction may be as small as several nanometers, such as from approximately 2 nm to approximately 20 nm. Each active region 204 may take the shape of a rectangle, or another geometric shapes including polygonal shapes.

FIG. 2 also illustrates providing an active region having a passivation layer disposed thereon. An edge passivation 208 and a surface passivation 210 layer are disposed on the 2D material forming the active regions 204. The surface passivation 210 and/or the edge passivation 208 may provide for protection of 2D the material of the active region 204 from exposure to an ambient atmosphere, thereby avoiding reaction with moisture in the ambient conditions. The surface passivation 210 and the edge passivation 208 may be formed in separate steps and may include the same or different materials. The surface passivation 210 and/or the edge passivation 208 may include oxidized metal composition, a dielectric composition, a semiconductor composition, and/or other suitable materials. In some embodiments, including as discussed below the passivation 208 and/or 210 is omitted (and/or removed, patterned, etc.) at least at regions including where a source/drain contact is to contact the active region 204, where a gate stack is disposed over the active region, and/or other regions requiring interface with the active region 204. Further discussion of the surface passivation and/or edge passivation may be provided in the application Ser. No. 14/969,813 entitled Field-Effect Transistors Having Black Phosphorous Channel and Methods of Making the Same, filed Dec. 15, 2015, the entire disclosure of which is hereby incorporated by reference.

FIGS. 3, 7, 10 and 13 introduce methods of fabricating FETs and providing contacts thereto using aspects of the present disclosure. FIGS. 4, 5, 6A, 6B, 8, 9, 11, 12, and 14 provide several views of exemplary embodiments of FETs fabricated according to the corresponding methods. One or more steps of the various methods may be combined to form a single FET. In other words, for example, elements of two methods (e.g., FIG. 3 and FIG. 7) may be performed to fabricate a single FET, such that the single FET may exhibit elements of both methods. In some embodiments, each method is performed to form a FET that does not necessitate elements of other embodiments. The methods of FIGS. 3, 7, 10 and 13 are merely exemplary, and are not intended to limit the present disclosure beyond what is explicitly recited in the claims. Additional operations can be provided before, during, and after each method, and some operations described can be replaced, eliminated, or moved around for additional embodiments of the method.

Figure 3:
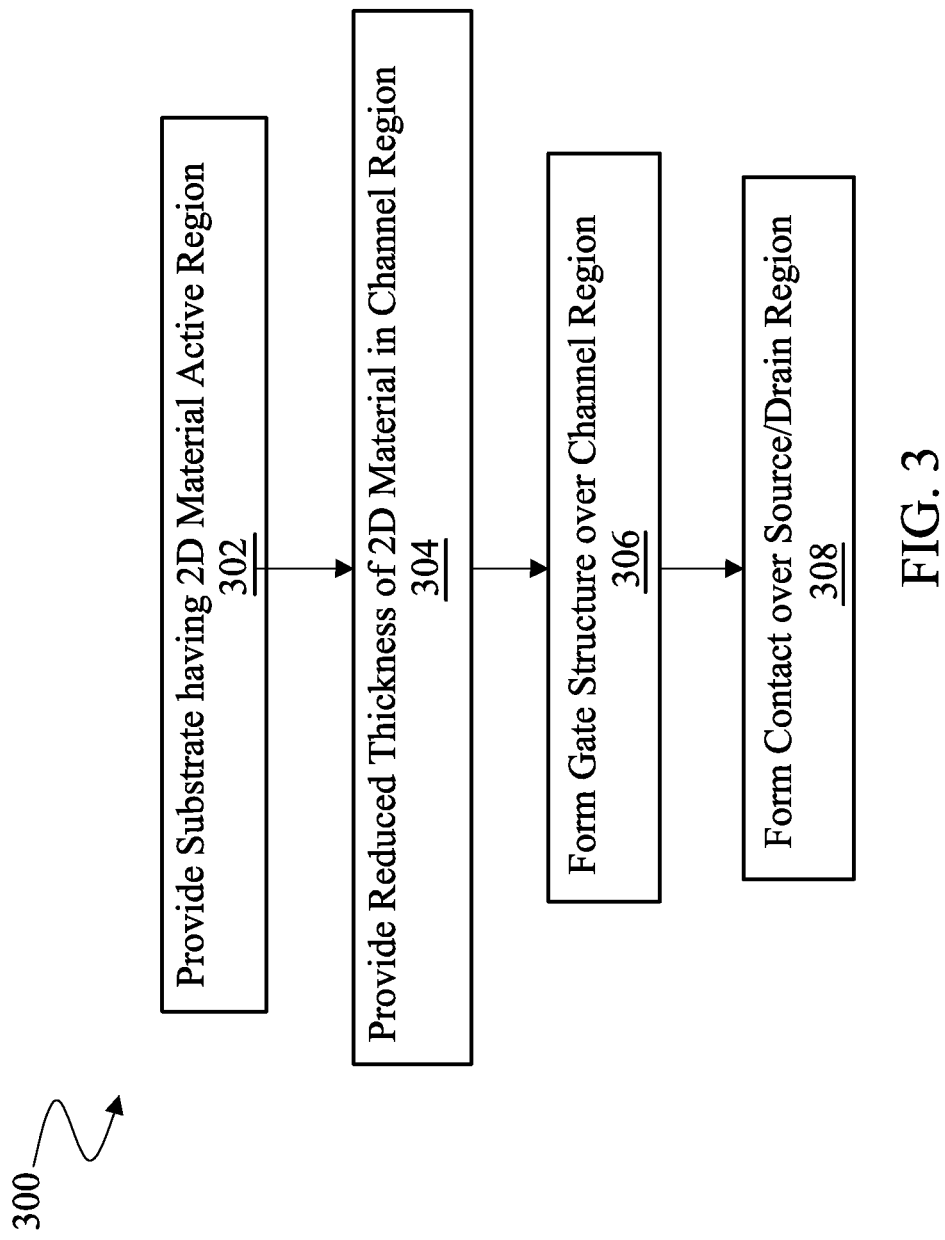
FIG. 3 is a flow chart illustrating an embodiment of a method of fabricating a FET including a modified thickness of 2D material according to various aspects of the present disclosure.
Figure 4:
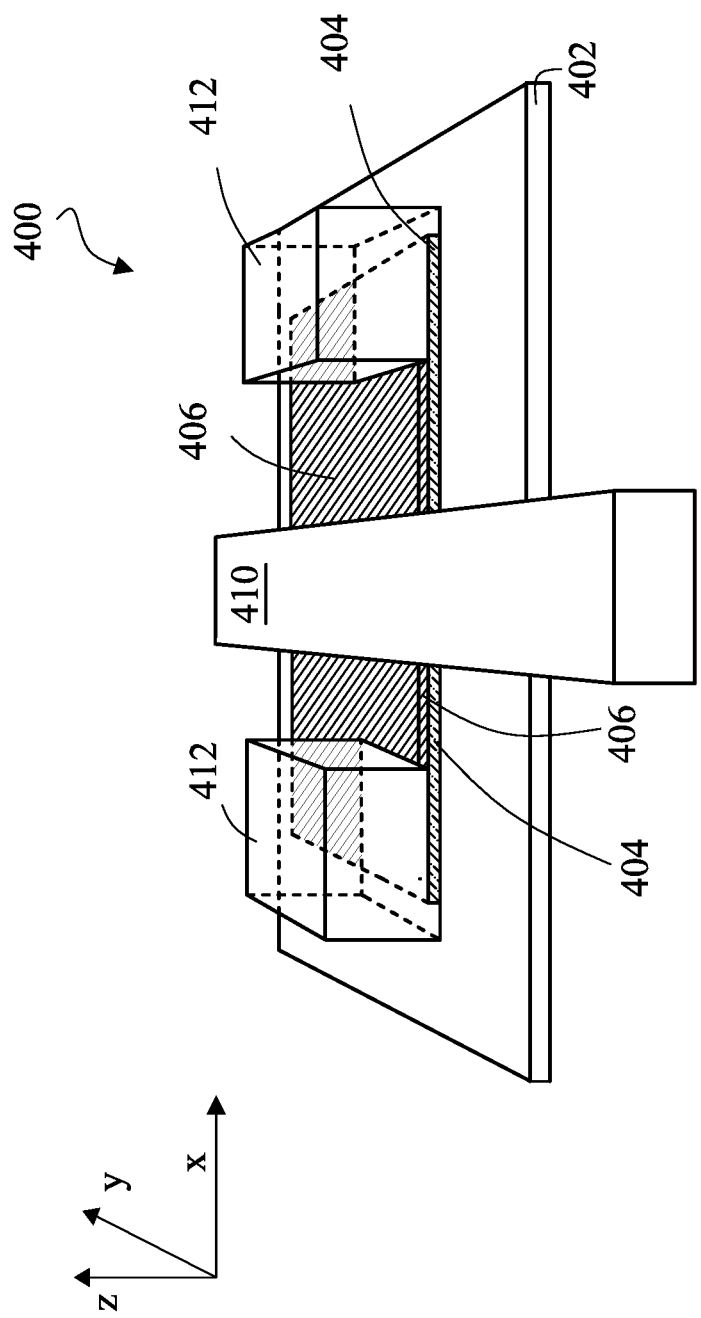
FIG. 4 is a perspective view of an embodiment of a FET constructed according to aspects of the method of FIG. 3 and according to various aspects of the present disclosure.

Referring now to FIG. 3, illustrated is a method 300 of fabricating a FET having a 2D active region and forming contacts thereto. In an embodiment of the method 300, a FET is fabricated, as discussed below, that includes an active region having a different thickness of 2D material in a channel region than the thickness of the 2D material in the source/drain region and/or the contact landing region of the source/drain region. FIGS. 4, 5, 6A and 6B provide views from different perspectives of an embodiment of a corresponding FET 400, fabricated according to one or more aspects of the present disclosure and illustrative of an embodiment of the method 300. It is noted that while FIG. 4 illustrates a single FET 400, FIGS. 5 and 6A/6B illustrate two FETs 400 (400B); however, any number of FETs may be formed simultaneously using the method 300.

The method 300 begins at stage 302 where a substrate is provided having an active region including a 2D material. The substrate may include a dielectric layer such as described above with reference to insulating layer 202 of FIG. 2. The active region may be substantially similar to the active region 204, discussed above with reference to FIG. 2. The 2D material may be BP layer including one or more layers of phosphorene. One or more layers of other 2D materials are also possible.

The substrate may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Example compositions include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

Referring to the example of FIG. 4, a substrate 402 is provided. The substrate 402 include an insulating layer such as silicon oxide or other suitable insulating material. In an embodiment, an insulating layer forms a top surface of the substrate 402 such that the active layer 404 is disposed directly upon the insulating layer. In an embodiment, the substrate 402 includes a first semiconductor layer disposed on the bulk substrate and a dielectric layer disposed on the first semiconductor layer. The dielectric layer may form a top surface for the active layer 404 to be disposed thereon. The dielectric layer may extend between shallow trench isolation features, discussed below. The STI features may extend further from the surface of a top surface of the substrate 402 than the dielectric layer. In other embodiments, the active layer 404 is disposed on semiconductor material. A 2D material region (e.g., BP layer) 404 is disposed on the substrate 402. (It is noted that while referred to herein as a BP layer 404, one of ordinary skill in the art would recognize other 2D materials now known or later developed may benefit from the present disclosure and the methods and devices presented herein also include embodiments of other 2D materials). The BP layer 404 may be substantially similar to the active region 204, discussed above with reference to FIG. 2, and/or comprise a material substantially similar to the BP 100, described above with reference to FIGS. 1A, 1B. In embodiments, the substrate 402 includes a layer of insulating material and the BP layer 404 is formed directly on the surface of the insulating layer.

The BP layer 404 may include one or more layers (e.g., phosphorene). The BP layer 404 is discussed in further detail below including its thickness profile including t1 and t2 (FIGS. 6A, 6B (including t3)).

The BP layer 404 may have a passivation layer 406 disposed on its top surface. The passivation layer 406 may be substantially similar to the passivation layer 210, described above with reference to FIG. 2. The passivation layer 406 may be a metal, a semiconductor, or an insulating layer. In an embodiment, the passivation layer 406 is formed before block 304, discussed below. Portions of the passivation layer 406 may be removed from (or alternatively not formed upon) regions of the BP layer 404 where another feature is to interface with the BP layer 404, for example, regions contacting the gate structure or contact.

The method 300 then proceeds to block 304 where a thickness profile having regions of varying thicknesses of the 2D material is provided. In an embodiment, the thickness of the BP material is modified after deposition, for example, block 304 is performed after block 302. In an embodiment, the BP material thickness is not modified, block 304 being optional for inclusion in some embodiments of the method 300.

In some embodiments, various patterning methods may be used to modify the thickness of the BP material, including for example forming masking elements disposed on the active region during the modification/deposition. The thickness of the BP material may be modified in various ways. For example, layer-by-layer etching may be used to control the thickness of the BP material. In an embodiment, long term exposure to ambient conditions results in a layer-by-layer etching process. In an embodiment, an electrochemical reaction between tungsten anode and black phosphorous cathode in moisture can remove BP layers by a tungsten probe in a layer-by-layer fashion.

Figure 6A:
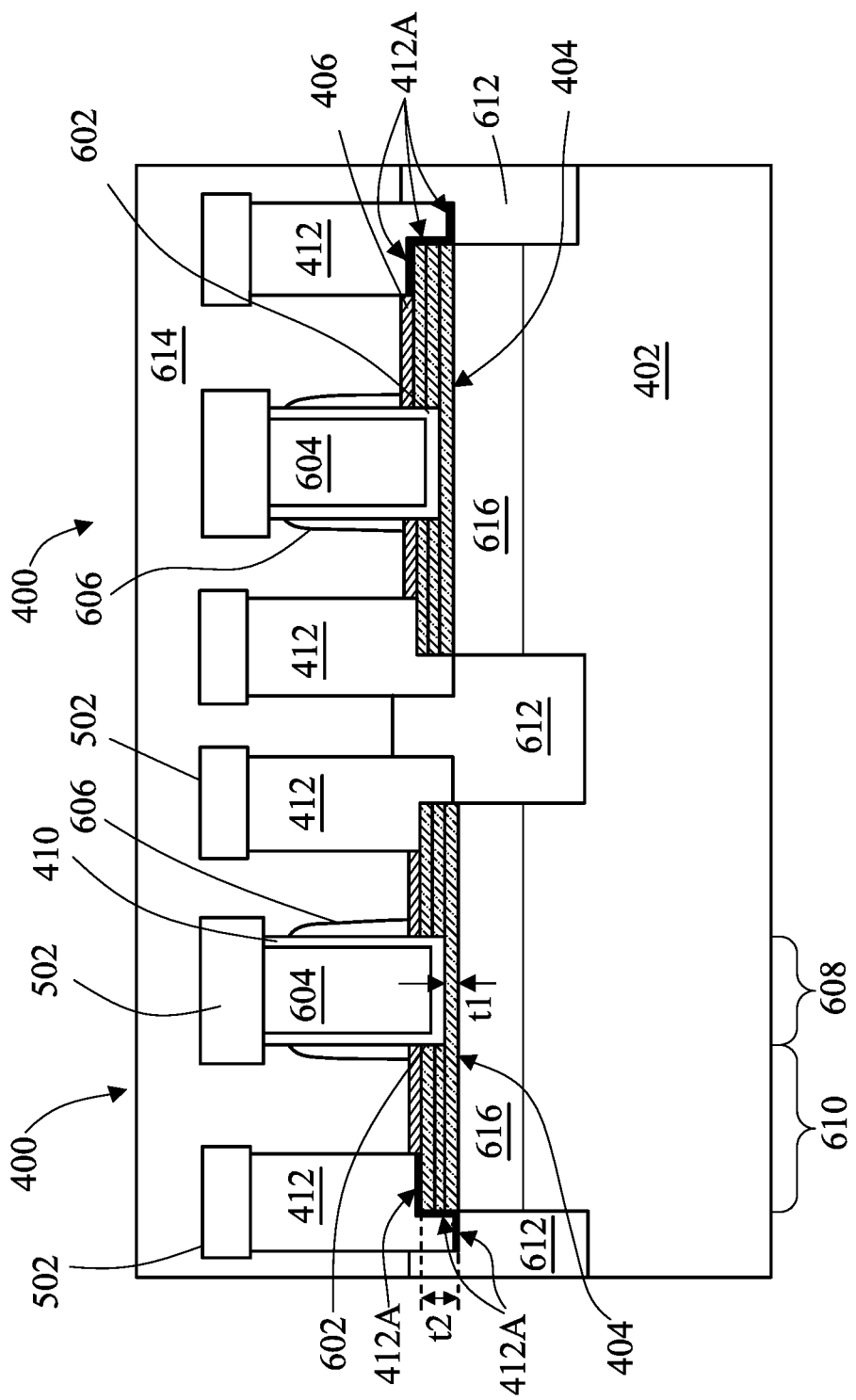
FIGS. 6A and 6B are a corresponding cross-sectional view of embodiments of FETs constructed according to aspects of the method of FIG. 3 and according to various aspects of the present disclosure.

In an embodiment, the thickness of the BP layer 404 is less in the channel region (e.g., underlying the gate structure) as compared to the 2D material thickness in the source/drain region (S/D region) which extends from the channel region. In an embodiment, the thickness of the BP layer 404 in the channel region is at least one atomic layer thinner than the BP layer 404 in the S/D region. For example, in an embodiment, the material is a BP layer having x layers of phophorene in the channel region and x+y layers of phosphorene in the S/D region, where x is 1 or greater and y is 1 or greater. In a further embodiment, x is equal to 1 and y is equal to two. FIG. 6A illustrates the BP layer 404 has a thickness t1 at a first region (e.g., channel region as discussed below) and a second thickness t2 at a second region (e.g., S/D region as discussed below). The thickness t1 is less than the thickness t2. FIG. 6A illustrates an example of the thickness t1 being one monolayer of phosphorene and the thickness t2 being three layers of phosphorene. However, other thicknesses are possible and within the scope of the present disclosure.

In an embodiment, a single monolayer of BP has a thickness of about 0.54 nm. Thus, in an embodiment, the BP layer 404 is a single monolayer in the channel region 610 and t1 may be approximately 0.54 nm. In an embodiment, the BP layer 404 has a thickness of t2 of about 10 monolayers of BP. Thus, in an embodiment, the thickness t2 may be approximately 5.4 nm. In an embodiment, the difference between t2 and t1 is at least one monolayer. Thus, the difference between t2 and t1 may be 0.54 nm or greater. In a further embodiment, the difference between t2 and t1 is about 0.54 nm. In an embodiment, the difference between t2 and t1 is 10 monolayers. In a further embodiment, the difference between t2 and t1 is about 5.4 nm. In an embodiment, the difference between t2 and t1 is greater than 0.54 nm and less than 10 nm.

The thickness profile of the method 300, exemplified in t1 and t2 of FIG. 6A, may provide in some embodiments certain advantages. For example, the energy band gap of the BP layer is reduced with increasing thickness. The reduction of the band gap may be caused by the increase of conduction band minimum (CBM) more than the reduction of valence band maximum (VBM). As a result, the Schottky barrier height for electron transport is reduced. In some embodiments, the thickness profile also provides a benefit of greater edge area (thickness t2) for contact landing, thus, contact resistivity can be further reduced. Similar advantages may be provided by some embodiments of the device 400B of FIG. 6B, discussed below.

The method 300 then proceeds to block 306 where a gate structure is formed over a channel region of the 2D material. The gate structure may include a gate dielectric and gate electrode. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. In an embodiment, the gate electrode is a metal gate material. The metal gate material may be selected to provide the appropriate work function. The gate structure is formed by a suitable process, including deposition, lithography patterning, and etching processes. The deposition processes include chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods. As discussed above, passivation layers may be removed/omitted where the gate structure is placed. In some embodiments, the gate structure is formed as a dummy gate structure (e.g., polysilicon) that is subsequently replaced by a final metal gate structure in a process known as a replacement gate process.

Figure 5:
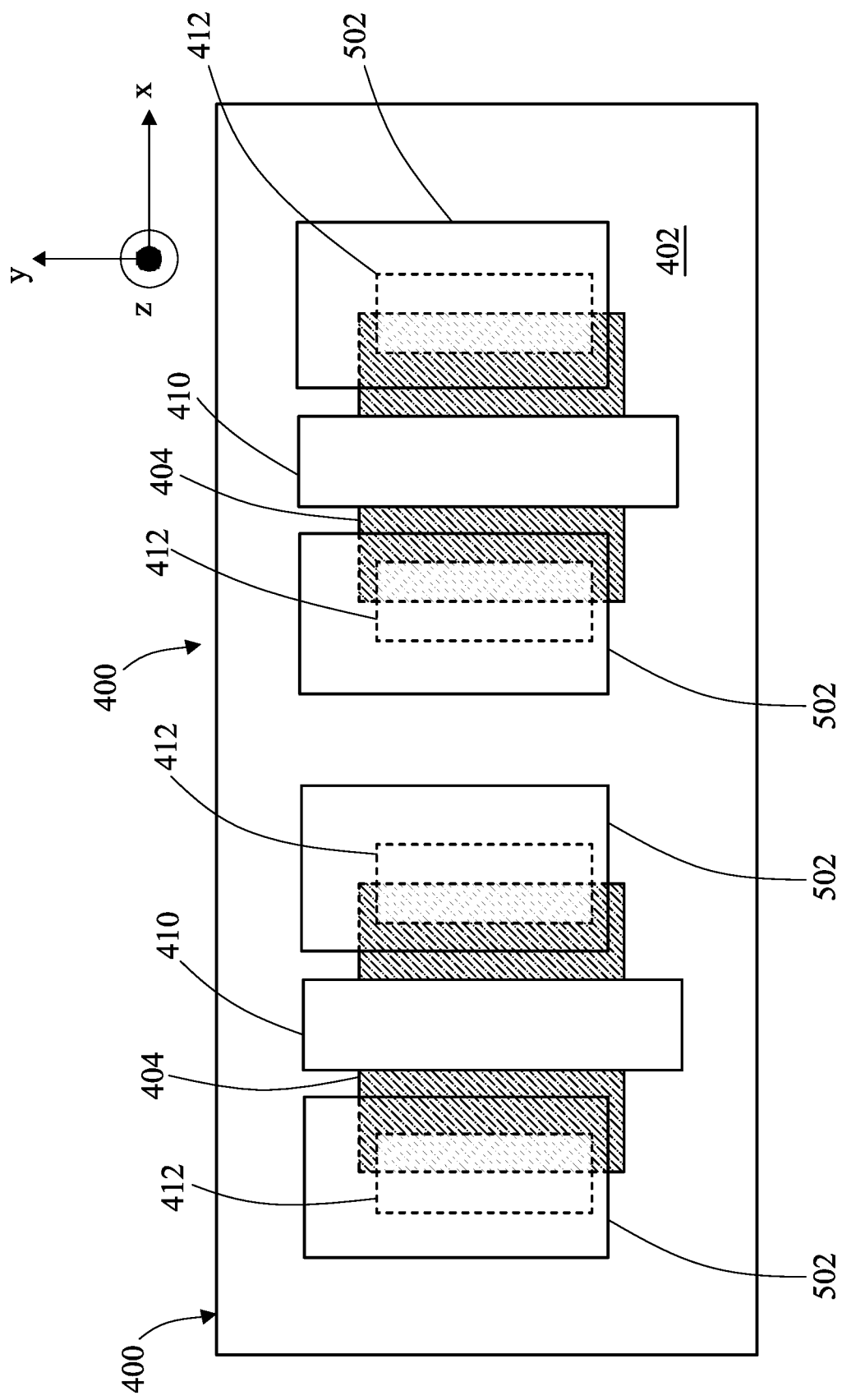
FIG. 5 is a corresponding top view of an embodiment of a FET constructed according to aspects of the method of FIG. 3 and according to various aspects of the present disclosure.

Referring to the examples of FIGS. 4, 5, and 6A/6B, a gate structure 410 is disposed over the BP layer 404. The gate structure 410 includes a gate dielectric layer 602 and a gate electrode 604 (FIGS. 6A/6B). Spacer elements 606 may be disposed on the sidewalls of the gate structure 410. The spacer elements 606 may be a suitable dielectric material such as, for example, silicon oxide, silicon nitride, or silicon oxynitride. In an embodiment, the spacer elements 606 are omitted. The gate structure 410 may directly interface the BP layer 404. As illustrated in FIGS. 6A/6B, in an embodiment, the gate dielectric 602 directly interfaces the BP layer 404. A channel region 608 of the BP layer 602 is directly underneath the gate structure 410 (gate dielectric layer 602) while the other portions of the BP layer 404 are referred to as source/drain (S/D) regions 610 (which would include an S/D extensions underneath the gate spacer 606). As discussed previously, the thickness t1 in the channel region 608 of the BP layer 404 is less than the thickness t2 in the S/D region 610 of the BP layer 404.

The method 300 then proceeds to block 308 where a contact is formed to the S/D region of the 2D material. In an embodiment, a dielectric layer such as an interlayer dielectric (ILD) layer is formed on the substrate above the active region of 2D material. The ILD layer may include a dielectric composition such as low-k material. Suitable low k material may include fluorinated silica glass (FSG), tetraethylorthosilicate (TEOS) oxide, un-doped silicate glass, or doped silicon oxide such as borophosphosilicate glass (BPSG), phosphosilicate glass (PSG), boron doped silicon glass (BSG), and/or other suitable dielectric materials. The ILD layer may be deposited by a PECVD, flowable CVD process or other suitable deposition technique. Other exemplary compositions for the ILD layer include silicon oxide or silicon nitride.

After deposition, in some embodiments, the ILD layer may then be etched back or planarized by a chemical mechanical planarization (CMP) process, for example, in preparation for a replacement gate process. In an embodiment, a contact etch stop layer (CESL) may be formed underneath the ILD layer. The CESL may include silicon nitride, silicon oxynitride, silicon nitride with oxygen (O) or carbon (C) elements, and/or other materials. Referring to the example of FIGS. 6A/6B, an ILD layer 614 is disposed on the substrate 402.

Continuing the discussion to form the contact, the contact may be formed using suitable patterning of the ILD layer to form holes (or openings) in the ILD layer aligned with the desired contact position (e.g., exposing portions of the S/D region of the 2D material). For example, the photolithography process forms a masking element such as a hard mask and the ILD layer is then etched through the hard mask. The etching process may include a suitable wet etch, dry (plasma) etch, and/or other processes. For example, a dry etching process may use chlorine-containing gases, fluorine-containing gases, other etching gases, or a combination thereof. The wet etching solutions may include NH$_4$OH, HF (hydrofluoric acid) or diluted HF, deionized water, TMAH (tetramethylammonium hydroxide), other suitable wet etching solutions, or combinations thereof.

In an embodiment, the etching process forming the holes in the ILD layer 614 may stop at the passivation layer 406. After forming the holes, the contact formation process may continue by removing the exposed passivation layer 406 in the holes, thereby exposing the 2D material 404 underneath.

After etching of holes in the ILD layer, conductive material may be deposited within the holes and contacting the exposed 2D material. Deposition techniques include chemical vapor deposition (CVD), atomic layer deposition (ALD), physical vapor deposition (PVD), and/or other suitable deposition processes. Referring to the example of FIGS. 4, 5, and 6A/6B, contact 412 is formed. The material of contact 412 is conductive, and may be metallic nitrides, elemental metals, and/or combinations thereof. Example compositions include copper (Cu), tungsten (W), titanium (Ti), aluminum (Al), hafnium (Hf), molybdenum (Mo), scandium (Sc), yttium (Y), nickel (Ni), platinum (Pt), and/or other suitable metals. Example metal nitride compositions include titanium nitride (TiN), tantalum nitride (TaN), tungsten nitride (WN), and/or other suitable metal nitrides. The contact 412 is illustrated as rectangular in shape, however, it contacts, including as fabricated, may be cylindrical in shape.

The material for the contact may be selected to provide an appropriate work function for the associated FET. For example, in an embodiment, the FET 400 is a p-channel field-effect transistor, and the contact 412 has a material with a work function higher than about 4.5 eV. In another embodiment, the FET 400 is an n-channel field-effect transistor, and the contact 412 has a material with a work function lower than about 4.5 eV. In other words, the contact 412 of FIGS. 6A/6B for example, may include different compositions. A higher work-function metal such as Pd with a 5.4 eV can provide a smaller contact resistance than nickel (Ni) having a 5.0 eV work function.

As illustrated in FIGS. 4, 5, and 6A/6B, the contact 412 is formed to interface the S/D region 610 of the BP layer 404. The contact 412 has a terminal surface 412A that interfaces or directly contacts a first portion the BP layer 404, a second portion that interfaces or directly contacts a sidewall of the BP layer 404, and a third portion that does not interface the BP layer 404. (It is noted that the surface 412A is in embodiments merely an interface, any thickness illustrated in the Figures, e.g., FIG. 6A is for reference only and not in itself intended to imply a separate layer.) The third portion of the terminal surface 412A contacts the substrate 402. As illustrated in FIG. 6A, in an embodiment, a portion of the terminal surface 412A interfaces the isolation feature 612 of the substrate 402. The isolation feature 612 may be substantially similar to portions of the insulating layer 202, described above with reference to FIG. 2. In an embodiment, the isolation feature 612 is a shallow trench isolation feature that interposes the active regions provided by the BP layer 404.

The isolation features 612 may be composed of silicon oxide, silicon nitride, silicon oxynitride, fluorine-doped silicate glass (FSG), a low-k dielectric, combinations thereof, and/or other suitable material known in the art. In an embodiment, the isolation features 612 are shallow trench isolation (STI) features formed by etching trenches in the substrate 402. The trenches may then be filled with isolating material, followed by a chemical mechanical polishing (CMP) process. However, other embodiments are possible. As discussed above, in an embodiment a dielectric layer 616 is included in the substrate 402.

As illustrated in FIG. 6A, the contact 412 has an interface (e.g., directly contacts) with a sidewall of the BP layer 404. The interface at the sidewall has an interface length of t2, or the thickness of BP layer 404 at the S/D region 610.

In another embodiment, the terminal surface 412A of the contact 412 completely interfaces a top surface of the BP layer 404. This is illustrated below with reference to FIG. 18. In another embodiment, the terminal surface 412A of the contact 412 completely interfaces the substrate 402 interfacing a sidewall of the BP layer 404 only by a sidewall of the contact 412. This is illustrated below with reference to FIGS. 15, 16, and 17.

The method 300 may continue to provide additional metallization layers and/or interposing dielectric layers of a multi-layer interconnect on the substrate. The metallization layers (e.g., including metal 1 or M1) may include copper, tungsten, aluminum, titanium, tantalum, silicide, and/or other suitable conductive materials. The metallization layers may be disposed in the illustrated or subsequent ILD layers (also referred to as an inter-metal dielectric (IMD)). FIGS. 5 and 6 illustrate a metal layer 502 connected to the contact 412. The metal layer 502 may include metal one or M1 layer.

In some embodiments, the method 300 and/or the device(s) 400 may provide for certain advantages. For example, as a 2D active region is dangling bond free on its top surface, a contact interfacing this top surface may exhibit a relatively higher resistance as compared to a contact interfacing an edge state of the 2D material. In some embodiments, the increased thickness in the source/drain region of the active region creates a longer interface between the edge state of the 2D material and the conductive material of the contact. Similar advantages may be present in some embodiments of the device 400B described below.

Figure 6B:
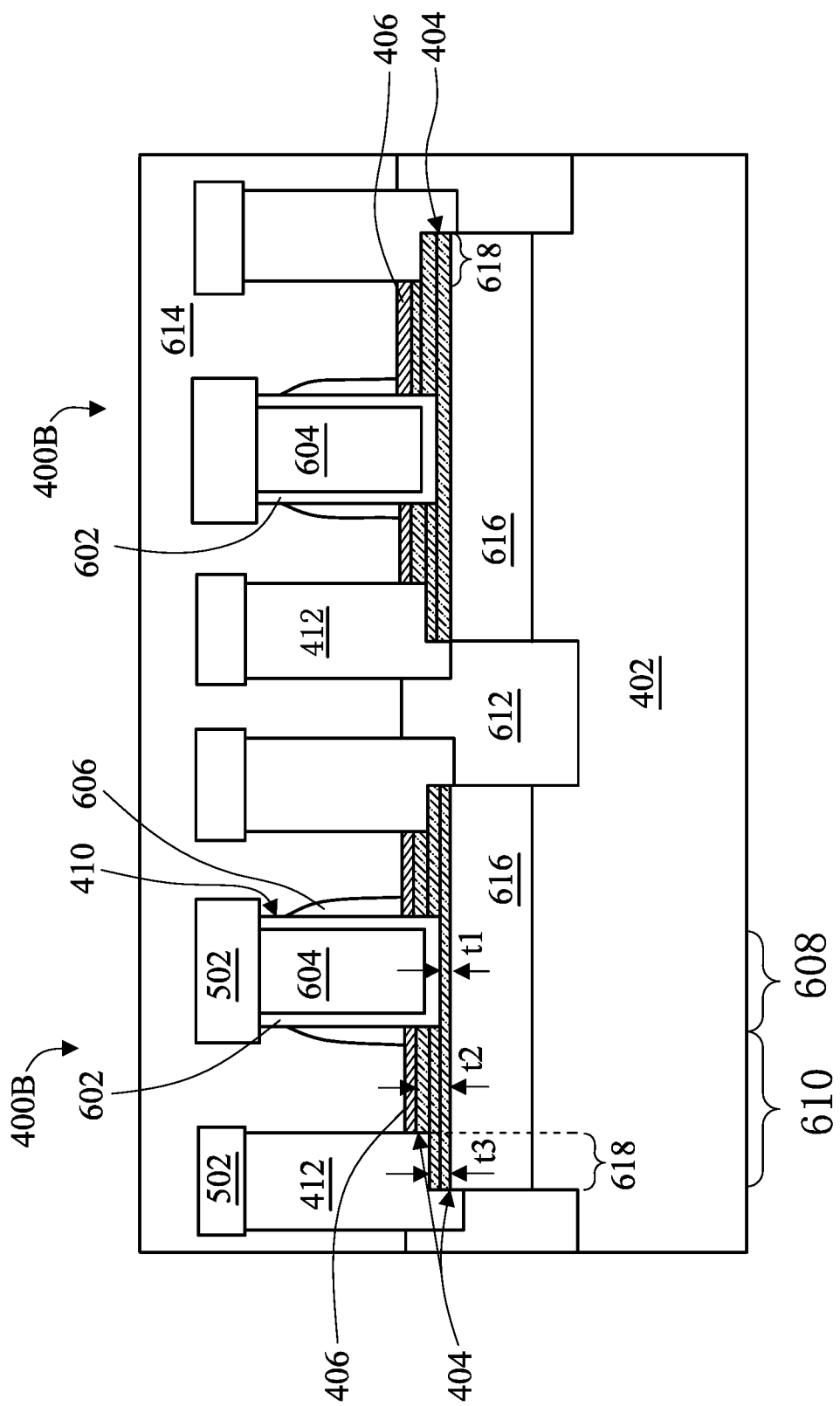

Referring now to FIG. 6B, illustrated is another embodiment of the device(s) 400, denoted 400B, similarly illustrated by FIGS. 4 and 5. The device 400B may also be fabricated using the method 300, substantially similar to as discussed above. It is noted that FIG. 6B is substantially similar to FIG. 6A, except with differences noted herein. Specifically, FIG. 6B illustrates a contact landing region 618 of the source/drain region 610. The contact landing region 618 is the region of the BP layer 404 where the contact 412 interfaces the layer 404. (see, e.g., FIG. 5 illustrating the overlap of 412 and 404 on the top view). FIG. 6A illustrates an embodiment where the contact landing region of the BP layer 404 has a substantially similar thickness as the other portions of the BP layer 404 in the source/drain region 610, e.g. t2. FIG. 6B however, illustrates an embodiment where the contact landing region 618 of the BP layer 404 has a different thickness than the BP layer 404 in the other portions of the source/drain region 610. FIG. 6B illustrates a thickness t3 in the contact landing region 618.

In an embodiment, the BP layer 404 is formed with a first thickness (e.g., t2) throughout the source/drain region 610 including in the contact landing region 618. During the opening of the holes (e.g., in layer 614), as described above with reference to block 308 of the method 300, within which the contact 412 is formed, one or more layers of the BP layer 404 may be removed during the etching. In other embodiments, the BP layer 404 may be formed having a thickness t3 in the contact landing region 618 prior to the formation of the contacts.

Thus, in an embodiment, the thickness of the BP layer 404 is less in the channel region (e.g., underlying the gate structure) t1 as compared to the thickness t2 of the 2D material in the source/drain region (S/D region) t2 and/or the thickness t3 of contact landing region 618 of the S/D region. In an embodiment, the thickness of the thickness t3 of contact landing region 618 is at least one atomic layer thinner than the BP layer 404 in the S/D region. For example, in an embodiment, the material is a BP layer having x layers of phophorene in the channel region and x+y layers of phosphorene in the S/D region, and x+z in the contact landing region where x is 1 or greater, y is 1 or greater, and z is 1 or greater. In an embodiment, the thickness t3 is equal to the thickness t1, and the thickness t2 is greater. In an embodiment, the thickness t1 an t2 are equal, and the thickness t3 is at least one atomic layer thinner. In a further embodiment, x is equal to 1, y is equal to two, and z is equal to 1. FIG. 6B illustrates the BP layer 404 has a thickness t1 at a first region (e.g., channel region) and a second thickness t2 at a second region (e.g., S/D region) and a third thickness t3 at a third region (e.g. contact landing region). However, other thicknesses are possible and within the scope of the present disclosure.

As discussed above, in an embodiment, a single monolayer of BP has a thickness of about 0.54 nm. Thus, in an embodiment, the BP layer 404 is a single monolayer in the channel region 610 and t1 may be approximately 0.54 nm. In an embodiment, the BP layer 404 has a thickness of t2 of about 10 monolayers of BP. In an embodiment, the BP layer 404 has a thickness of t3 of about 9 monolayers of BP. Thus, in an embodiment, the thickness t2 may be approximately 5.4 nm, thickness t3 may be approximately 4.86 nm. In an embodiment, the difference between t3 and t2 is at least one monolayer. Thus, the difference between t3 and t2 may be 0.54 nm or greater. In a further embodiment, the difference between t3 and t2 is about 0.54 nm. Further relationships between thicknesses t1 and t2 are discussed above with reference to FIG. 6A and applicable herein also.

As illustrated in FIG. 6B, the contact 412 has an interface (e.g., directly contacts) with a sidewall of the BP layer 404. The interface at the sidewall has an interface length of t3, or the thickness of BP layer 404 in the contact landing region 618.

In another embodiment, a terminal surface (e.g., bottom surface) of the contact 412 completely interfaces a top surface of the BP layer 404. This is illustrated below with reference to FIG. 18. In another embodiment, the terminal surface of the contact 412 completely interfaces the substrate 402 interfacing a sidewall of the BP layer 404 only by a sidewall of the contact 412 (e.g., extending the length t3). This is illustrated below with reference to FIGS. 15, 16, and 17.

Figure 7:
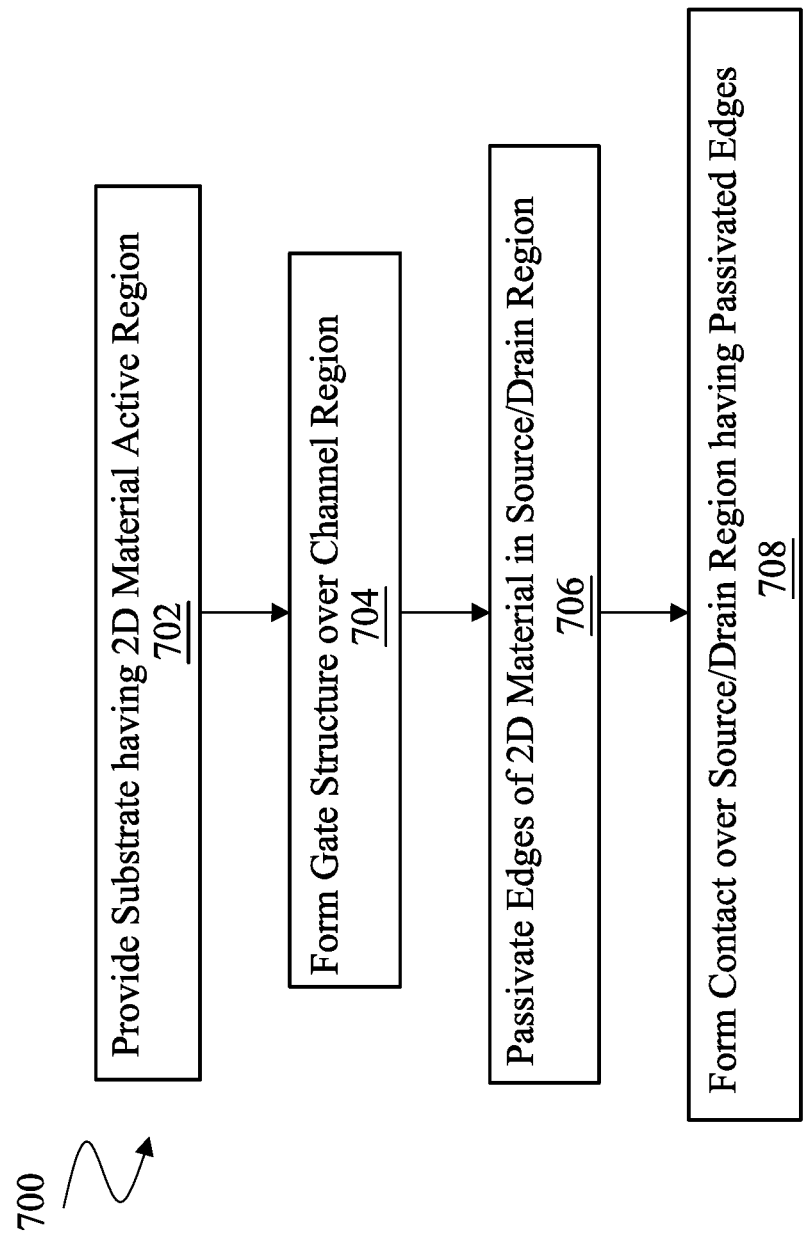
FIG. 7 is a flow chart illustrating an embodiment of a method of fabricating a FET including having a passivated 2D material edge, according to various aspects of the present disclosure.
Figure 8:
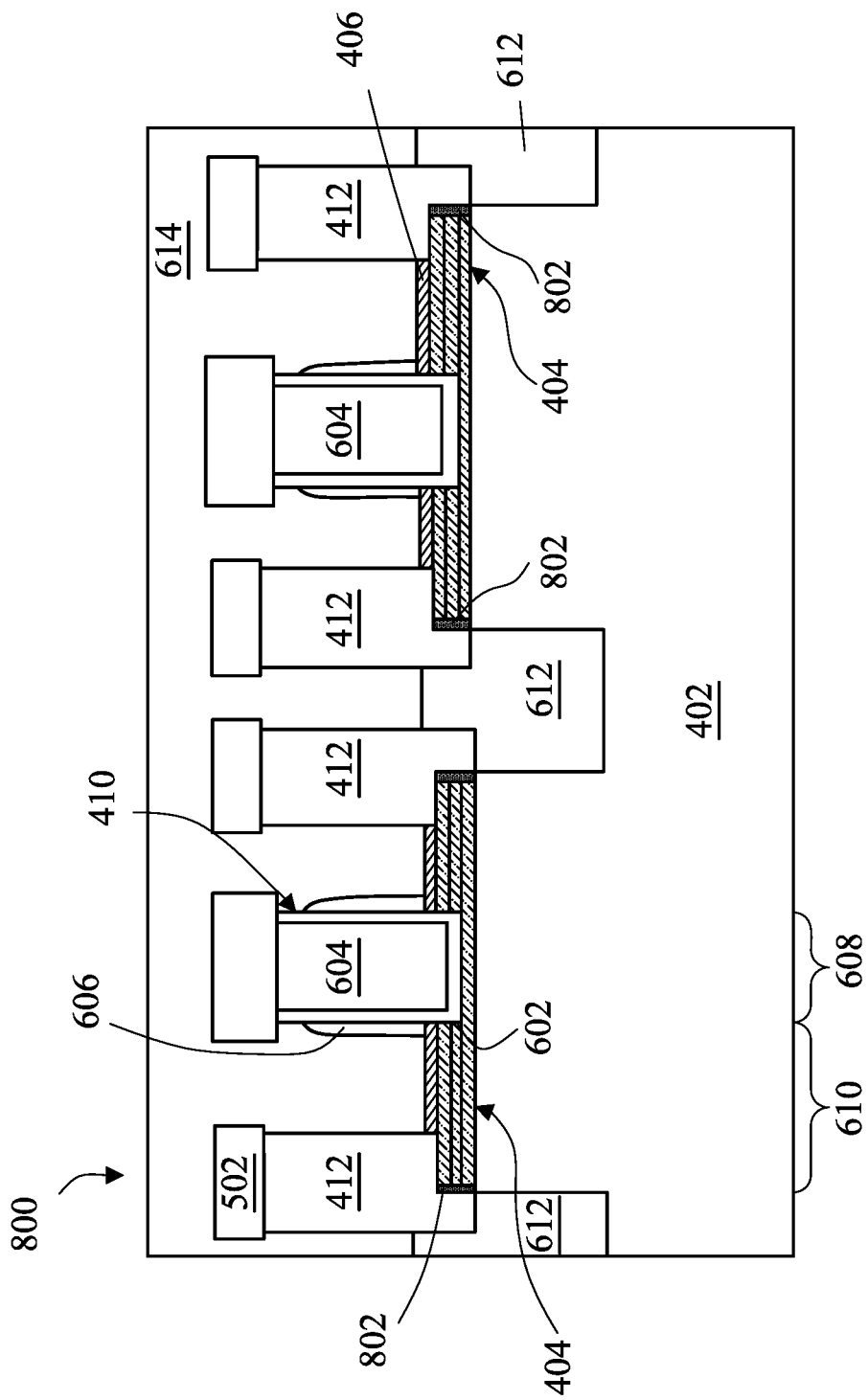
FIG. 8 is a cross-sectional view of an embodiment of FETs constructed according to aspects of the method of FIG. 7 and according to various aspects of the present disclosure.
Figure 9:
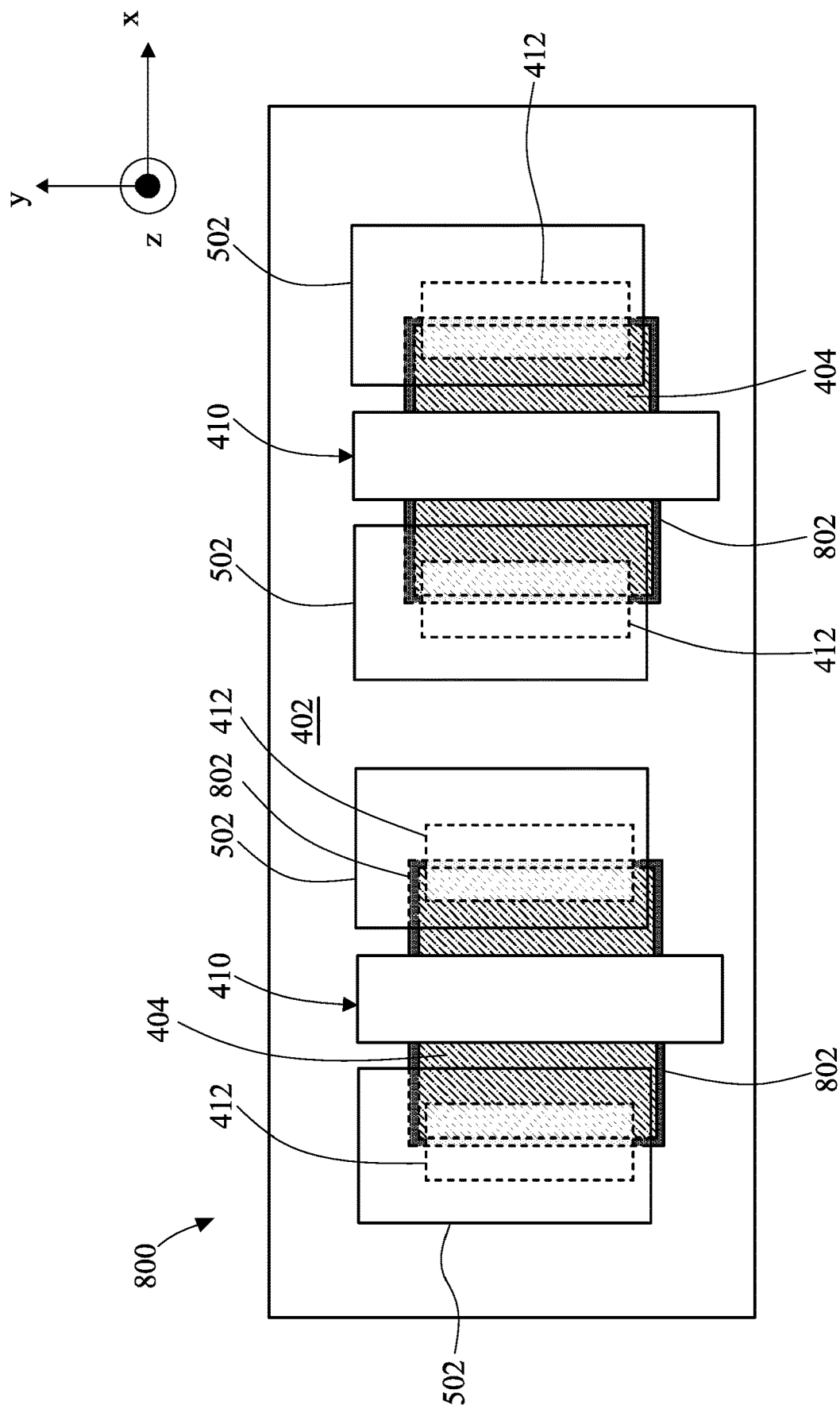
FIG. 9 is a corresponding top view of the embodiment of FETs of FIG. 8.

Referring now to FIG. 7, illustrated is a method 700 of fabricating a FET having an active region of 2D material and forming contacts thereto. The method 700 includes passivating edges of the 2D material in the source/drain region. In some embodiments, the passivating can reduce contact resistance. FIGS. 8 and 9 provide views from different perspectives of an embodiment of a corresponding FET 800, fabricated according to one or more aspects of the present disclosure and illustrative of an embodiment of the method 700. The method 700 may be used in conjunction with elements of FIG. 3 (e.g., the formation of the different thickness 2D material may be used together with the passivating edges) to form a contact to a FET having a 2D material active region. In other embodiments, the method 700 may form a FET having a constant thickness active region.

The method 700 begins at block 702 where a substrate having an active region of 2D material is provided. Block 702 may be substantially similar to block 302 of the method 300, described above with reference to FIG. 3. Referring to the example of FIGS. 8 and 9, the device 800 includes a substrate 402 having isolation features 612 and an active region formed of 2D material (BP layer) 404. The substrate 402 may include a dielectric layer as described above that directly interfaces a bottom surface of the 2D material active region. The BP layer 404 forms an active region for each FET 800. The BP 404 may be substantially similar to as discussed above with reference to FIGS. 3, 4, 5, and 6. As illustrated in FIG. 8, the BP layer 404 of the active region has a thickness variation between a source/drain region 610 and a channel region 608. However in other embodiments, the thickness is constant. Passivation layer 406 is disposed on regions of the 2D material 404.

The method 700 then proceeds to block 704 where a gate structure is formed over a channel region of the 2D active material. Block 704 may be substantially similar to block 306 of the method 300, described above with reference to FIG. 3. Referring to the example of FIGS. 8 and 9, a gate structure 410 is disposed over BP layer 404. The channel region 608 of the BP layer 404 is defined under the gate structure 404; a source/drain region 610 of the BP layer 404 is adjacent the channel region 608 as discussed above. The gate structure 410 may include a gate dielectric layer 602 and a gate electrode 604. Spacer elements 606 are disposed on sidewalls of the gate structure 410. The gate structure 410 may be substantially similar to the gate structure 410 described above with reference to FIGS. 3, 4, 5, and 6.

The method 700 then proceeds to block 706 where the edges of the 2D material are passivated (e.g., atoms are adsorbed). In some embodiments, block 706 may be performed prior to block 704. The 2D material may be passivated by introducing atoms to the 2D layer where the atoms are at least one of oxygen, selenium, and sulfur adatoms (adsorbed atom). In an embodiment, the passivation process includes introducing two elements of selected from oxygen, selenium and sulfur. For example, the passivation process may include a mixture of oxygen and sulfur; a mixture of oxygen and selenium; or a mixture of oxygen, sulfur and selenium. In an embodiment, each element of the mixture has a minimum atomic concentration of 0.01%. In an embodiment, each element present of in the mixture has a maximum atomic concentration of 99.99%.

In an embodiment, the passivation process introduces atoms to the entirety of the BP layer, however, due to the top/bottom surfaces being relatively nonreactive; the passivation process affects the edges. For example, the edges of the 2D material layer have increased chemical reactivity due to the dangling bonds and only Van der Waals forces between adjacent layers as compared to a top surface of the 2D material layer. Therefore, the passivation process may be selective to the edges without affecting a top/bottom surface of the 2D material.

The passivation process provides for adsorbing atoms (oxygen, sulfur, or selenium) within the band gap. In an embodiment, the "arm chair edge" of the 2D material (BP layer) is passivated (e.g., the listed atoms are adsorbed). After passivation, the "arm chair edge" may maintain its semiconductive nature. In other words, in an embodiment, the adatoms may lower the band gap, but do not tune the band gap to the extent that the conduction band and valence band are significantly modified to transform the edge state to a metallic nature. In an embodiment, the "zigzag edge" of the 2D material (BP layer) is passivated. After passivation, the "zigzag edge" may increase in its metallic energy states such that it is increased in metallic nature. It is expected that the edge states resulting after passivation original from the weak unsaturated bond with P atoms. In other embodiments, the passivation may tune the edge condition such that it transitions from a semiconductor to a semimetal.

In an embodiment, the passivation process includes exposure of the 2D material to an oxygen gas. In a further embodiment, the passivation process also includes exposure of the 2D material to sulfur or selenium. As sulfur and selenium are solids at room temperature, various methods may be used to form the atoms. An ambient condition including sulfur or selenium may be generated by evaporating powders of sulfur or selenium. The atoms in the generated vapor (oxygen, selenium or sulfur) can be adsorbed by the edges of the 2D material (e.g., BP layer). In an embodiment, a sulfur powder is evaporated at around 400 Celsius. In an embodiment, a selenium power is evaporated at around 600 Celsius. The sulfur and/or selenium atoms can also be generated by decomposition of hydrogen sulfide gas and hydrogen selenide gas, respectively. The decomposition may be either thermal or plasma-assisted process.

Referring to the example of FIGS. 8 and 9, a passivated edge 802 is formed on the BP layer 404. The passivated edge 802 may include the arm-chair and zig-zag edge states. In an embodiment, the passivated edge 802 as a height of the thickness of the BP material 404 in the source/drain region 610 (e.g., t2). Thus, after subjection to the passivation process, in an embodiment, the device 800 has the passivated edge 802 is defined as a region of the 2D material (BP layer) including sulfur and/or selenium dopants. In a further embodiment, the remaining active region 404 (remaining BP layer inside of region 802) may be void of sulfur and/or selenium dopants. As illustrated in FIG. 9, the passivated edge 802 or doped region of the 2D material surrounds the un-doped 2D material.

The method 700 then proceeds to block 708 where a contact is formed to the source/drain region of the 2D material. Block 708 may be substantially similar to block 308 of the method 300, described above with reference to FIG. 3. Referring to the example of FIGS. 8 and 9, contacts 412 are formed to the BP layer 404 through ILD layer 614. The contacts 412 have a terminal surface that directly interfaces the passivated edge 802. Metallization layer 502 is coupled to the contacts 412 and/or the gate structure 410.

In some embodiments, the method 700 and/or exemplary device 800 provide for tuning the electrical conductivity at an edge of the active region where an interface with a contact is formed. In an embodiment, the tuning allows for increasing the metallic nature of the edge and thereby reducing the contact resistance.

Figure 10:
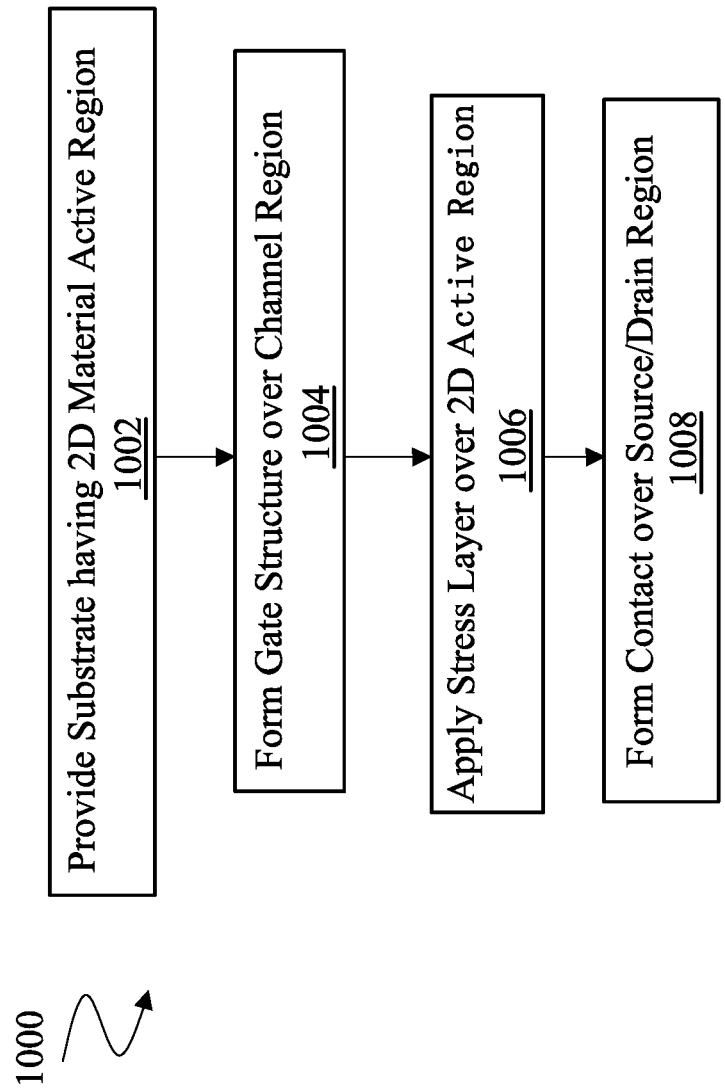
FIG. 10 is a flow chart illustrating an embodiment of a method of fabricating a FET including applying a stress layer, according to various aspects of the present disclosure.
Figure 11:
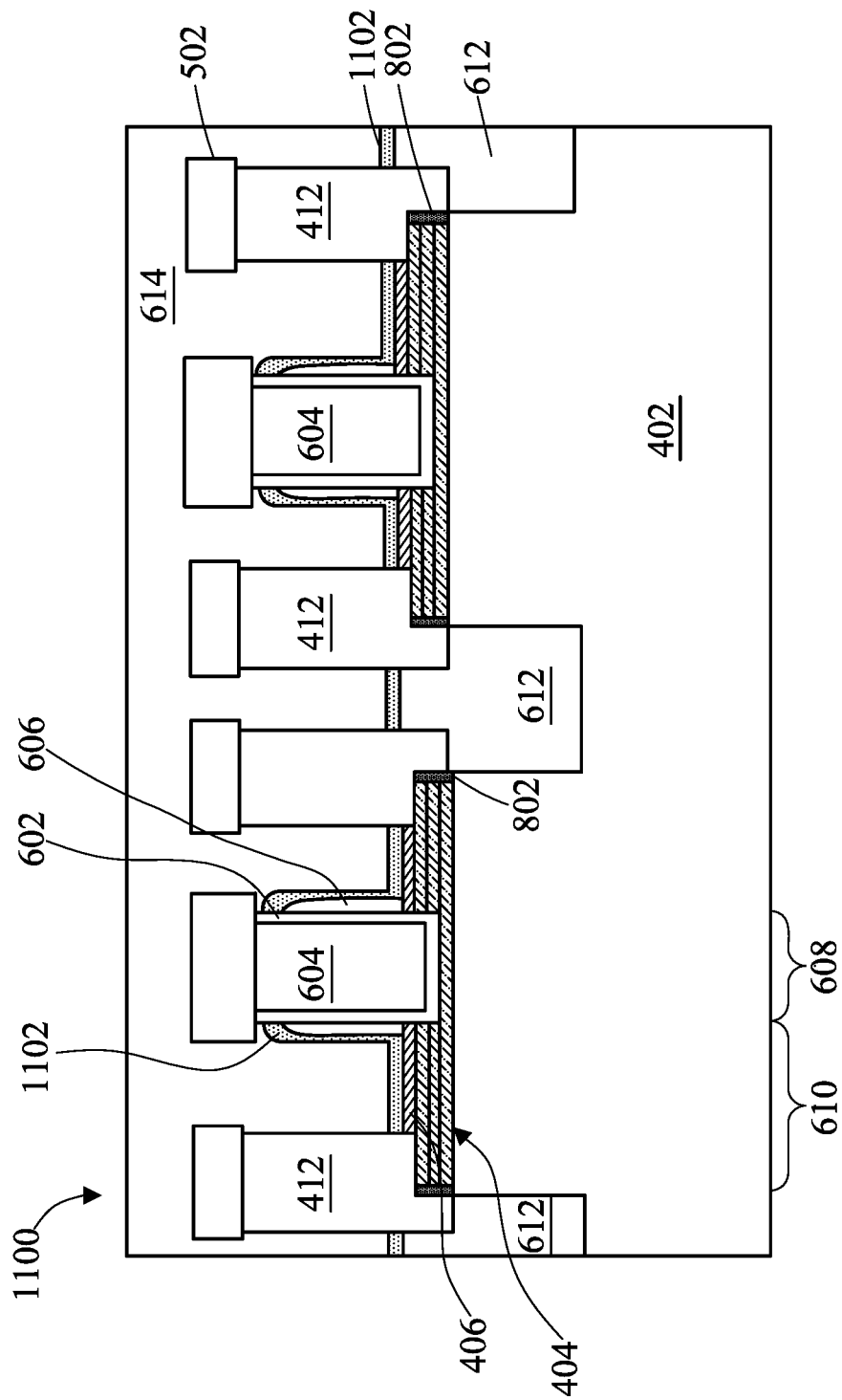
FIG. 11 is a cross-sectional view of an embodiment of FETs constructed according to aspects of the method of FIG. 10 and according to various aspects of the present disclosure.
Figure 12:
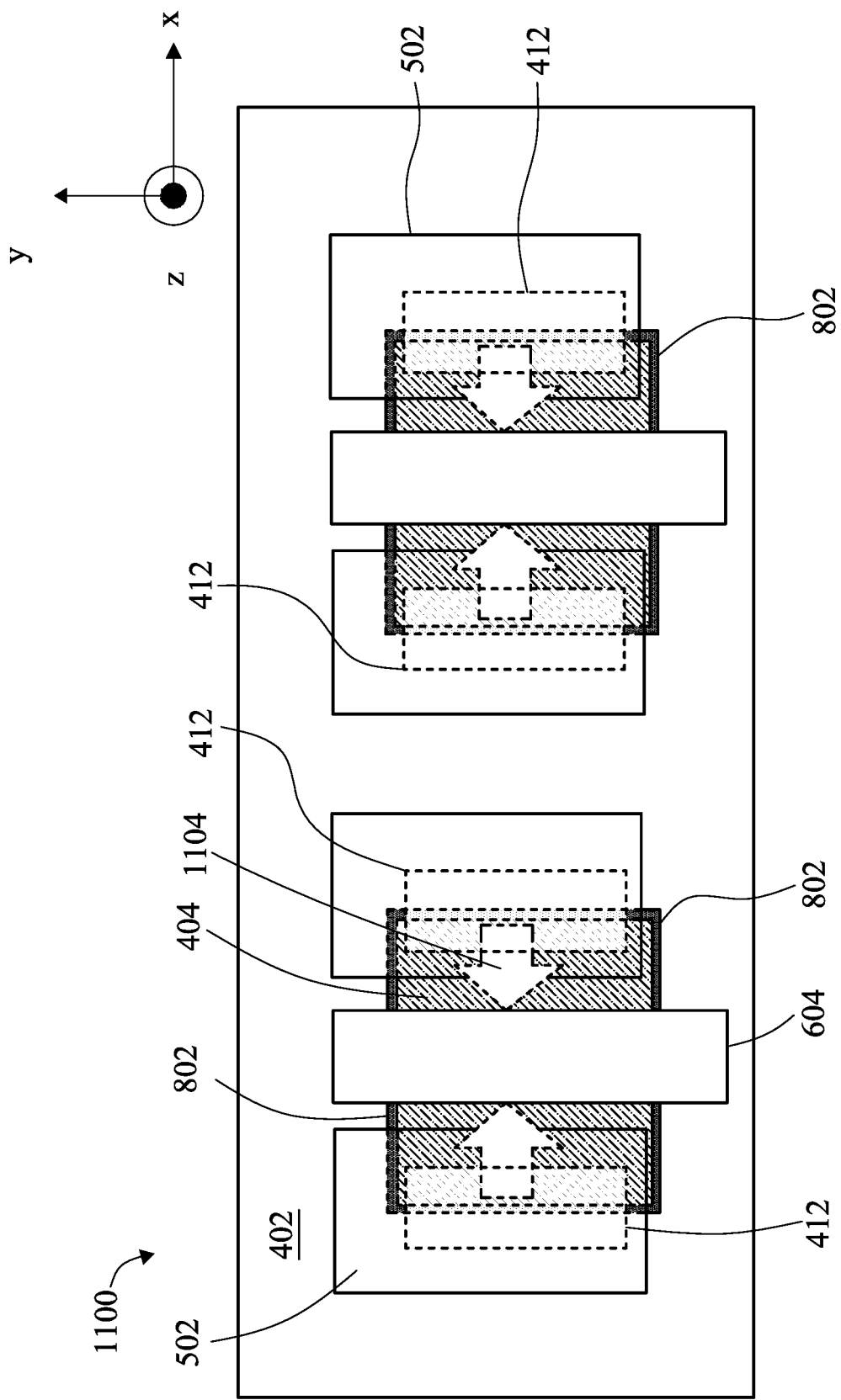
FIG. 12 is a corresponding top view of the embodiment of FETs of FIG. 11.

Referring now to FIG. 10, illustrated is a method 1000 of fabricating a FET having an active region of 2D material and forming contacts thereto. The method 1000 includes providing a stress layer over the 2D material in the source/drain region. In some embodiments, the stress layer can generate a compressive strain along the channel length. FIGS. 11 and 12 provide views from different perspectives of an embodiment of a corresponding FET 1100, fabricated according to one or more aspects of the present disclosure and illustrative of an embodiment of the method 1000. The method 1000 may be used in conjunction with elements of FIGS. 3 and/or 7 (e.g., the formation of the different thickness 2D material and/or passivating edges of the 2D material may be used in conjunction with the stress layer) to form a FET having a 2D material active region with a contact thereto. In some embodiments, the stress layer is disposed on a FET having a constant thickness 2D material active region. In some embodiments, the stress layer of the method 1000 is disposed on a FET without passivated edges (the method 700) of the 2D material.

The method 1000 begins at block 1002 where a substrate having an active region of 2D material is provided. Block 1002 may be substantially similar to block 302 of the method 300, described above with reference to FIG. 3. Referring to the example of FIGS. 11 and 12, the device 1100 includes a substrate 402 having isolation features 612 and an active region formed of 2D material (BP) 404. The BP layer 404 forms an active region for each FET 1100. The BP layer 404 may be substantially similar to as discussed above with reference to FIGS. 3, 4, 5, 6A/6B, 7, 8 and/or 9. As illustrated in FIG. 11, the BP layer 404 of the active region has a thickness variation between a source/drain region 610 and a channel region 608. However in other embodiments, the thickness is constant. Passivation layer 406 is disposed on regions of the 2D material 404. In an embodiment, the passivated edges 802 are formed on the 2D material 404 such as described above with reference to FIGS. 7, 8 and 9. However, in other embodiments, the passivated edges 802 are omitted.

The method 1000 then proceeds to block 1004 where a gate structure is formed over a channel region of the 2D material. Block 1004 may be substantially similar to block 306 of the method 300, described above with reference to FIG. 3. Referring to the example of FIGS. 11 and 12, a gate structure 410 is disposed over the BP layer 404. A channel region 608 of the 2D material 404 is defined under the gate structure 404; a source/drain region 610 of the 2D material 404 is adjacent the channel region 608 as discussed above. The gate structure 410 may include a gate dielectric layer 602 and a gate electrode 604. Spacer elements 606 are disposed on sidewalls of the gate structure 410. The gate structure 410 may be substantially similar to the gate structure 410 described above with reference to FIGS. 3, 4, 5, and 6A/6B.

The method 1000 then proceeds to block 1006 where a stress layer is formed over the 2D material in the active region.

In an embodiment, a compressive strain ranging up to −10% along the X direction is applied by the stress layer. This compressive strain allows for effective masses of holes and electron transports to be reduced in the BP layer. The strain design can also reduce Schottky barrier height and/or the transport mass in the BP layer. In an embodiment, the compressive strain in the x-direction can be generated by a compressive layer disposed over the 2D material. In an embodiment, the compressive layer is silicon nitride. However, other materials may be possible. In an embodiment, the stress layer also serves as a contact etch stop layer (CESL). The stress layer may be formed using plasma enhanced chemical vapor deposition (PECVD) processes and/or other suitable deposition processes.

In some embodiments, the energy band gap of the 2D material, e.g., BP layer, is also reduced by applying strain. In an embodiment, the strain applied is along the Y-direction and ranges between about −12% and +12%, where "−" is compressive strain and "+" is tensile strain. The effective masses of hole and electron transports are reduced by applying compressive strain ranging up to about −10% along X direction. Thus, in some embodiments, a proper strain design can reduce Schottky barrier height and the transport mass in black phosphorus FETs regardless if the Poisson ratio of monolayer black phosphorus is positive or negative.

Referring to the example of FIGS. 11 and 12, a stress layer 1102 is formed on the substrate 402 including over the 2D material 404. In an embodiment, the stress layer 1102 is silicon nitride. In an embodiment, the stress layer 1102 provides for compressive strain on the channel region (illustrated as strain 1104 in FIG. 12). The stress layer may enhance carrier mobility in the BP layer 404.

The method 1000 then proceeds to block 1008 where a contact is formed to the source/drain region of the 2D material. Block 1008 may be substantially similar to block 308 of the method 300, described above with reference to FIG. 3 and/or block 708 of the method 700, described above with reference to FIG. 7. Referring to the example of FIGS. 11 and 12, contacts 412 are formed to the 2D material 404 through ILD layer 614. Metallization layer 502 is coupled to the contacts 412 and/or the gate structure 410.

Figure 13:
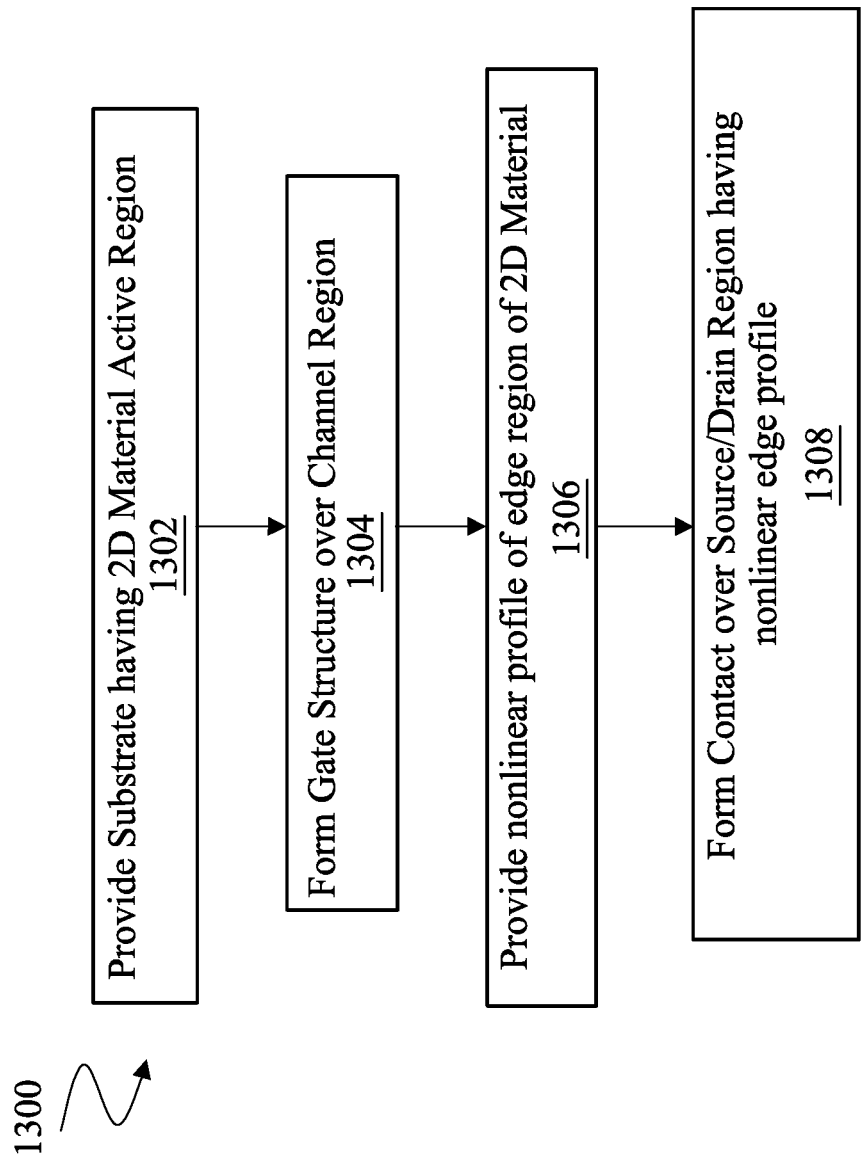
FIG. 13 is a flow chart illustrating an embodiment of a method of fabricating a FET including having a nonlinear profile 2D material edge, according to various aspects of the present disclosure.
Figure 14:
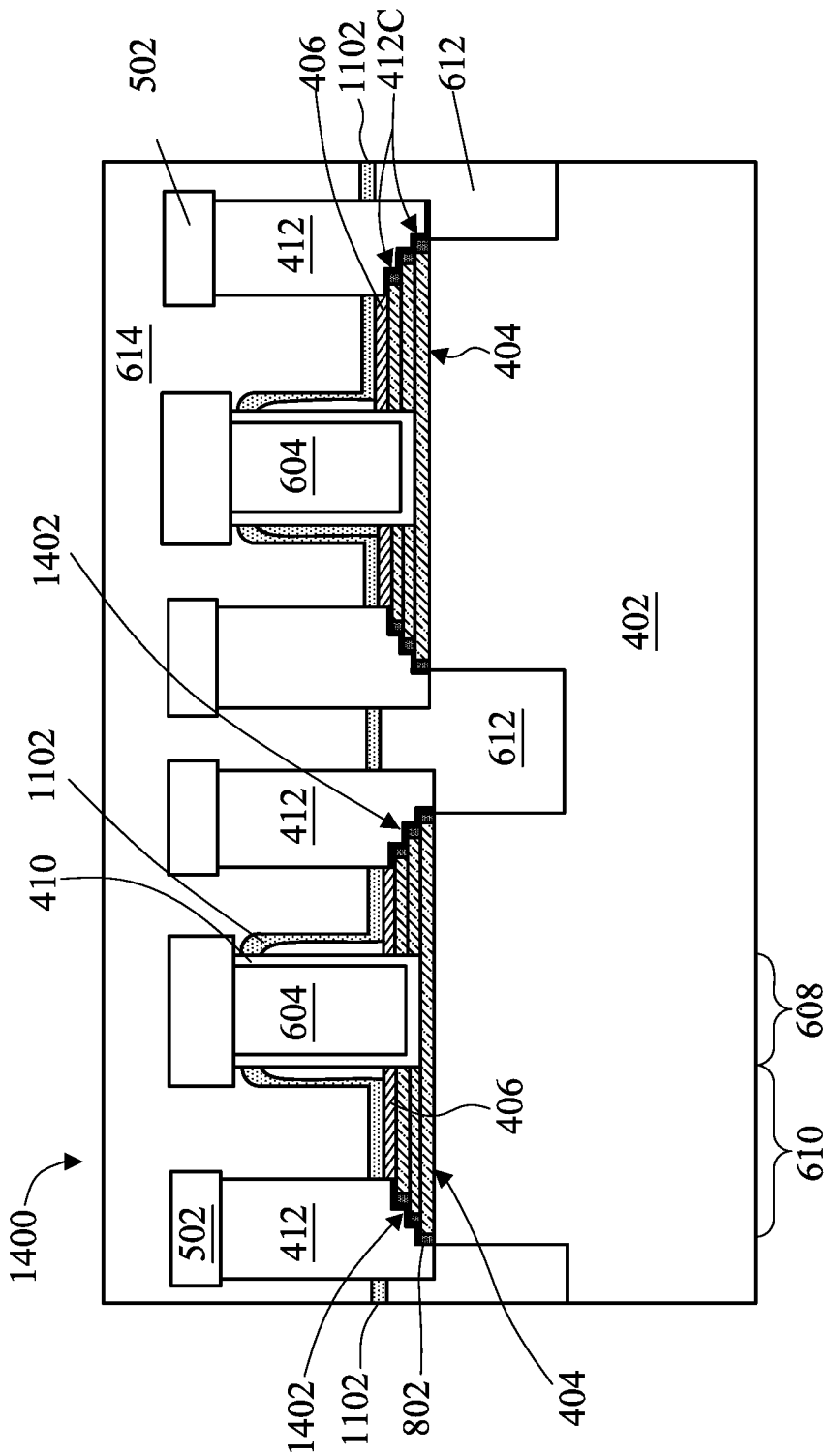
FIG. 14 is a cross-sectional view of an embodiment of FETs constructed according to aspects of the method of FIG. 13 and according to various aspects of the present disclosure.

Referring now to FIG. 13, illustrated is a method 1300 of fabricating a FET having an active region of 2D material and forming contacts thereto. The method 1300 includes providing a nonlinear edge profile for the 2D material forming the active region. FIG. 14 provides a cross-sectional view of an embodiment of a corresponding device 1400, fabricated according to one or more aspects of the present disclosure and illustrative of an embodiment of the method 1300. The method 1300 may be used in conjunction with elements of FIG. 3, FIG. 7, and/or FIG. 10 (e.g., the formation of the different thickness 2D material, passivating edges of the 2D material, and/or stress layers) to form a contact to a FET having a 2D material active region.

The method 1300 begins at block 1302 where a substrate having an active region of 2D material is provided. Block 1302 may be substantially similar to block 302 of the method 300, described above with reference to FIG. 3. Referring to the example of FIG. 14, the device 1400 includes a substrate 402 having isolation features 612 and an active region formed of 2D material (BP layer) 404. The BP layer 404 may be substantially similar to as discussed above with reference to FIG. 3, 4, 5, 6A/6B, 7, 8 and/or 9. As illustrated in FIG. 14, the BP layer 404 of the active region has a thickness variation between a source/drain region 610 and a channel region 608. However in other embodiments, the thickness is constant. Passivation layer 406 is disposed on regions of the BP layer 404. In an embodiment, passivated edges 802 are formed on the BP layer 404 (as discussed with reference to FIGS. 7, 8, and 9). However, in other embodiments, the passivated edges 802 are omitted. A stress layer 1102 is disposed on the substrate 402 including over the BP layer 404. The stress layer 1102 may be substantially similar to the stress layer 1102 described above with reference to FIGS. 10, 11, and 12. In some embodiments of the method 1300 and the device 1400, the stress layer 1102 is omitted.

The method 1300 then proceeds to block 1304 where a gate structure is formed over a channel region of the 2D material. Block 1304 may be substantially similar to block 306 of the method 300, described above with reference to FIG. 3. Referring to the example of FIG. 14, a gate structure 410 is disposed over the BP layer 404. The channel region 608 of the BP layer 404 is defined under the gate structure 404; a source/drain region 610 of the BP layer 404 is adjacent the channel region 608 as discussed above. The gate structure 410 may include a gate dielectric layer 602 and a gate electrode 604. Spacer elements 606 are disposed on sidewalls of the gate structure 410. The gate structure 410 may be substantially similar to the gate structure 410 described above with reference to FIGS. 3, 4, 5, and 6A/6B.

The method 1300 then proceeds to block 1306 where a nonlinear profile of an edge region of the 2D material is provided. Block 1306 may be performed prior to block 1304. In an embodiment, block 1306 may be performed with block 1302. For example, the nonlinear profile may be developed during the deposition of the 2D material. In some embodiments, the 2D material is etched to provide the nonlinear profile after deposition. In some embodiments, an etch process of the 2D material will target an edge and etch non-uniformity may develop the nonlinear profile Referring to the example of FIG. 14, an edge profile 1402 is formed on the BP layer 404. In an embodiment, the edge profile 1402 has a total height of the thickness of the BP layer 404 in the source/drain region 610 (e.g., t2). The edge profile 1402 may be provided around the entire edge of BP layer 404 of the active region, confirmed to the source/drain region 610, or confirmed to the region the contact 412 will interface. The edge profile 1402 has a sidewall of the BP layer 404 that is not collinear. In other words, a layer of the BP layer 404 is not aligned with a sidewall of an adjacent (overlying or underlying) layer. In an embodiment, a top surface portion of an underling layer of the BP layer 404 is exposed and directly interfaces the contact 412. In the illustrated embodiment, the edge profile 1402 is also referred to as a stair-stepped profile. However, different configurations may be possible that provide for a nonlinear sidewall (e.g., not vertically linear) of the 2D material. Again, the BP layer 404 may be any number of layers.

The method 1300 then proceeds to block 1308 where a contact is formed to the source/drain region of the 2D material. Block 1308 may be substantially similar to block 308 of the method 300, described above with reference to FIG. 3. Referring to the example of FIG. 14, contacts 412 are formed to the 2D material 404 through ILD layer 614. The contacts 412 have a terminal surface 412C that directly interfaces the nonlinear edge profile 1402. (It is noted that the surface 412C is in embodiments merely an interface, the thickness illustrated in the Figures, e.g., FIG. 14 is for reference only and not in itself intended to imply a separate layer.) Metallization layer 502 is coupled to the contacts 412 and/or the gate structure 410. In some embodiments, the passivated edges 802 are omitted and the 2D material edge state directly interfaces the contact 412.

Figure 15:
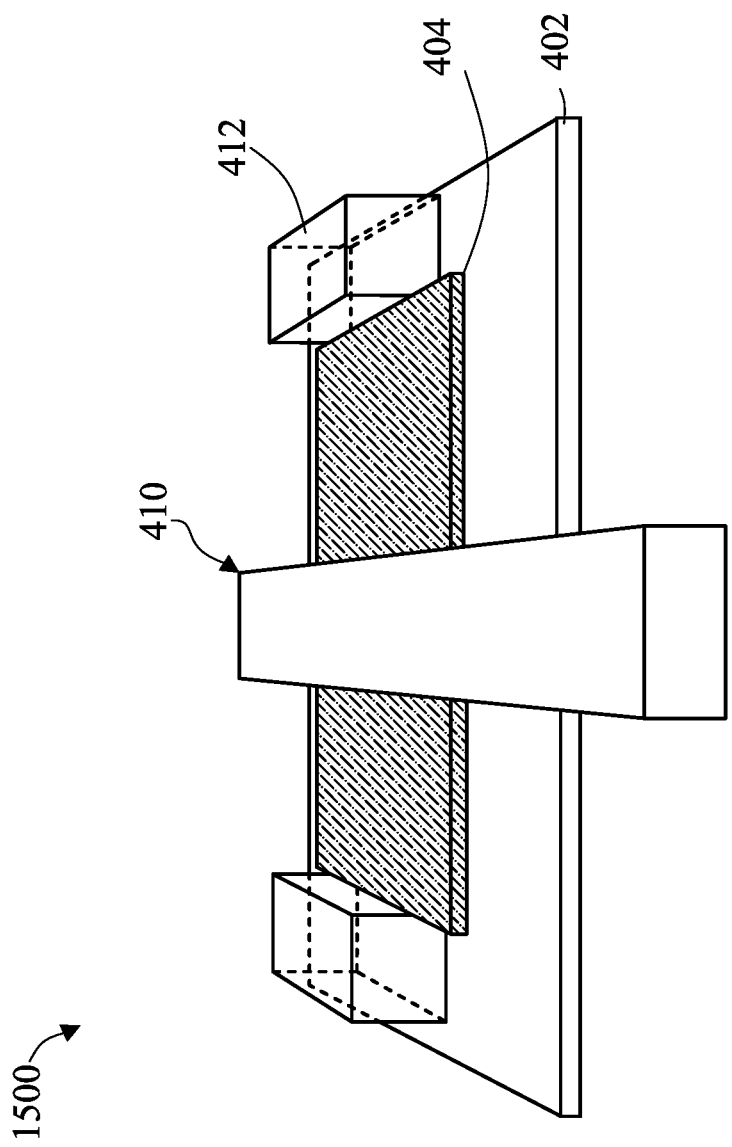
FIGS. 15 and 18 are perspective views of different embodiments of FETs with varying contact locations suitable for various aspects of the present disclosure.
Figure 16:
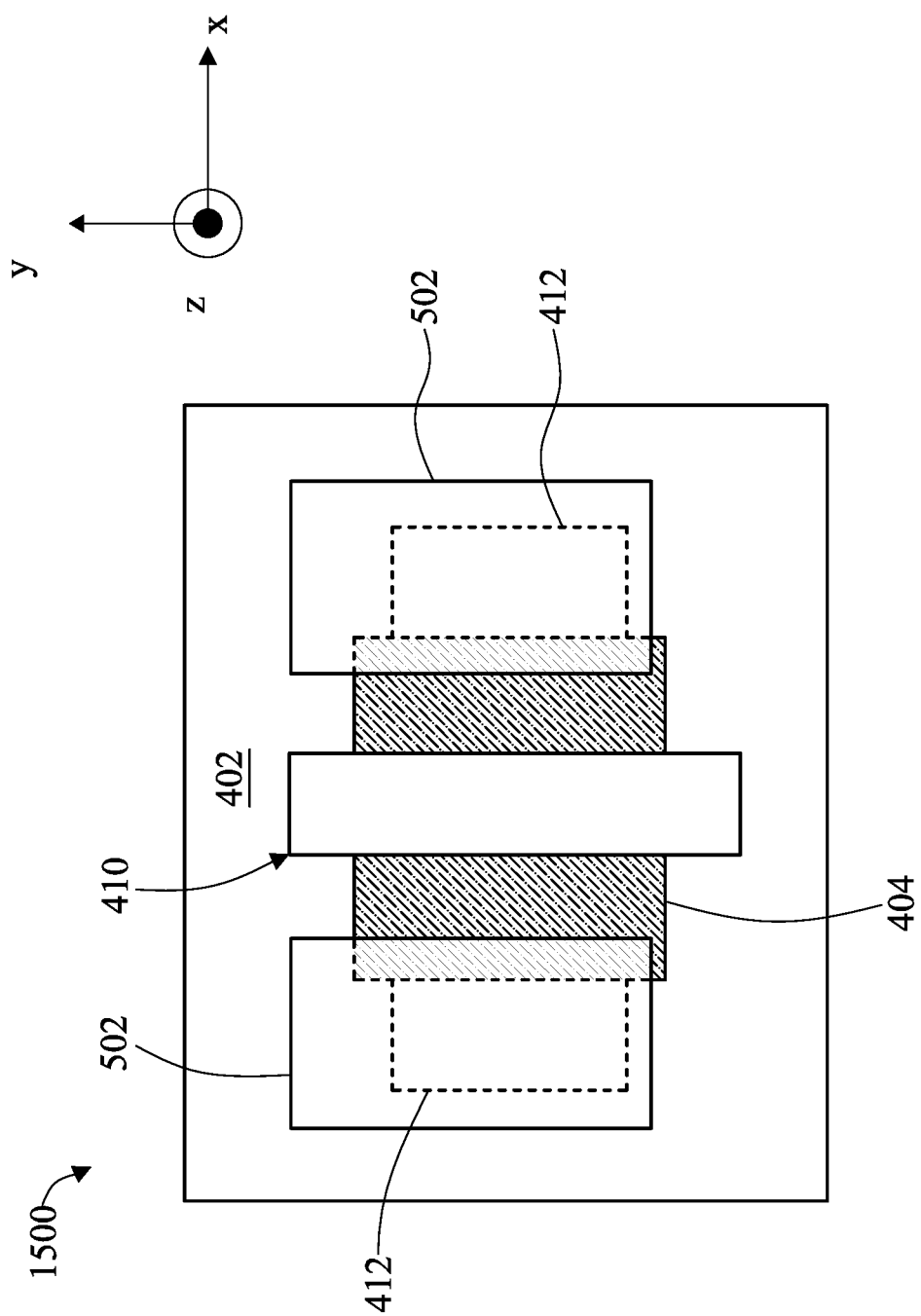
FIGS. 16 and 17 provide cross-sectional and top views corresponding to the embodiment of FIG. 15.
Figure 17:
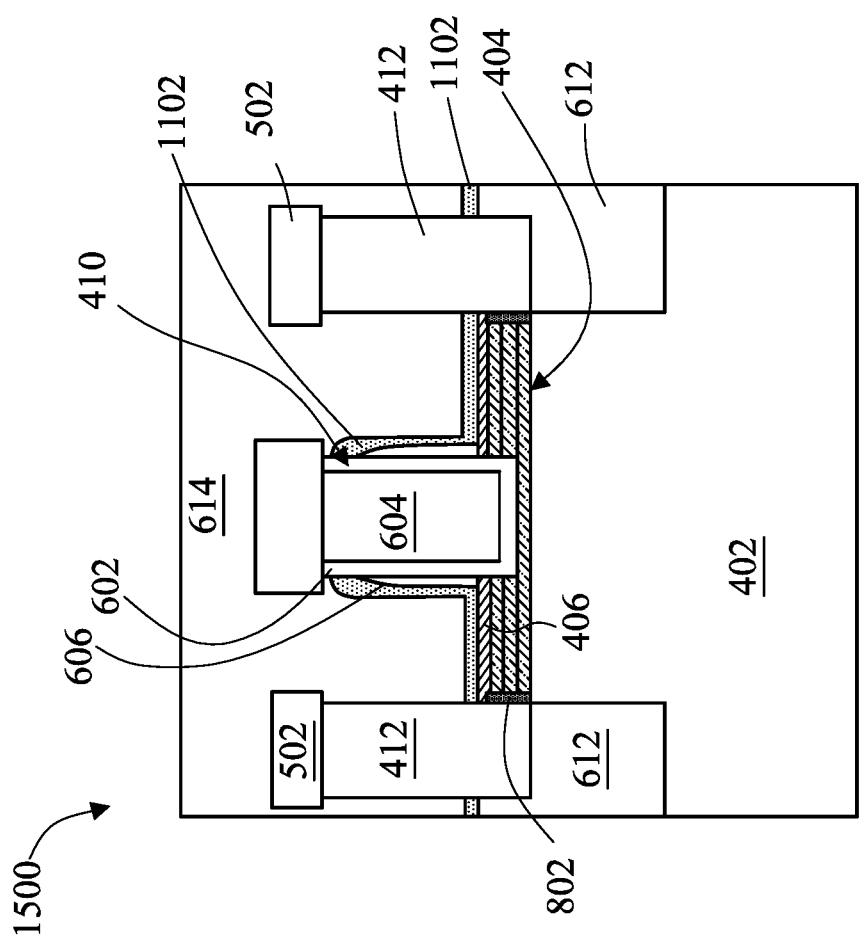

FIGS. 15, 16, and 17 are substantially similar to embodiments discussed above with certain differences highlighted in the following discussion. However, when not highlighted it is noted that the descriptions above equally apply to the embodiment of the device 1500. Specifically, FIGS. 15, 16, and 17 are illustrative of a device 1500 having a substrate 402, BP layer 404 forming an active region, and a gate structure 410 over the BP layer 404. Contacts 412 interface the BP layer 404. However, in contrast to the illustrated embodiments above, the contacts 412 of the device 1500 interface the BP layer 404 at a sidewall and do not interface a top surface of the BP layer 404. Any one of the methods 300, 700, 1000, and/or 1300 may be used to form the device 1500 understanding the interface with the contact 412 and the S/D region 610 of the BP layer 404 is provided at a (vertical) sidewall rather than a (vertical) sidewall and a top (horizontal) surface of the 2D material. Similar element numbers are used for convenience to indicate elements may be substantially similar to as discussed above, with the exception of the contact location and interface.

Figure 18:
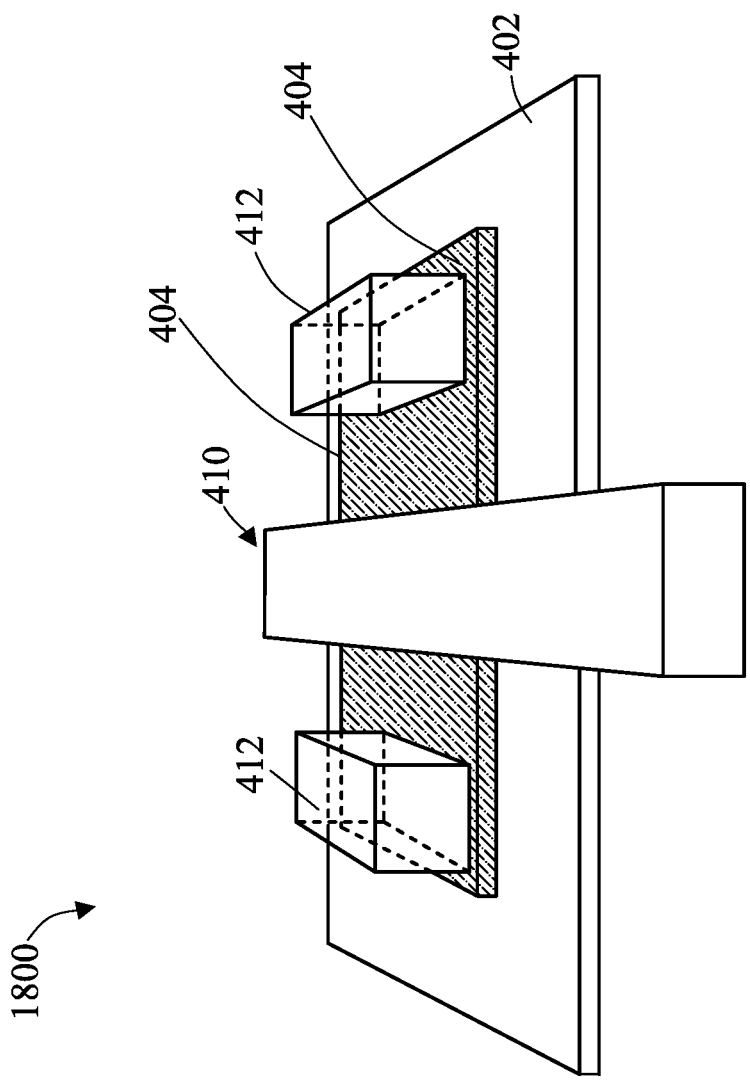

FIG. 18 is illustrative of a perspective view of a device 1800 having a substrate 402 upon which a 2D material (BP layer) 404 forming an active region for a gate structure 410 is disposed. Contacts 412 interface the BP layer 404 at a top surface of the 2D material. Any one of the methods 300, 700, 1000, and/or 1300 may be used to form the device 1800 understanding the interface with the contact 412 and the S/D region 610 of the BP layer 404 is provided at a top (horizontal) surface of the 2D material. Similar element numbers are used for convenience to indicate elements may be substantially similar to as discussed above, with the exception of the contact location and interface.

Figure 19A:
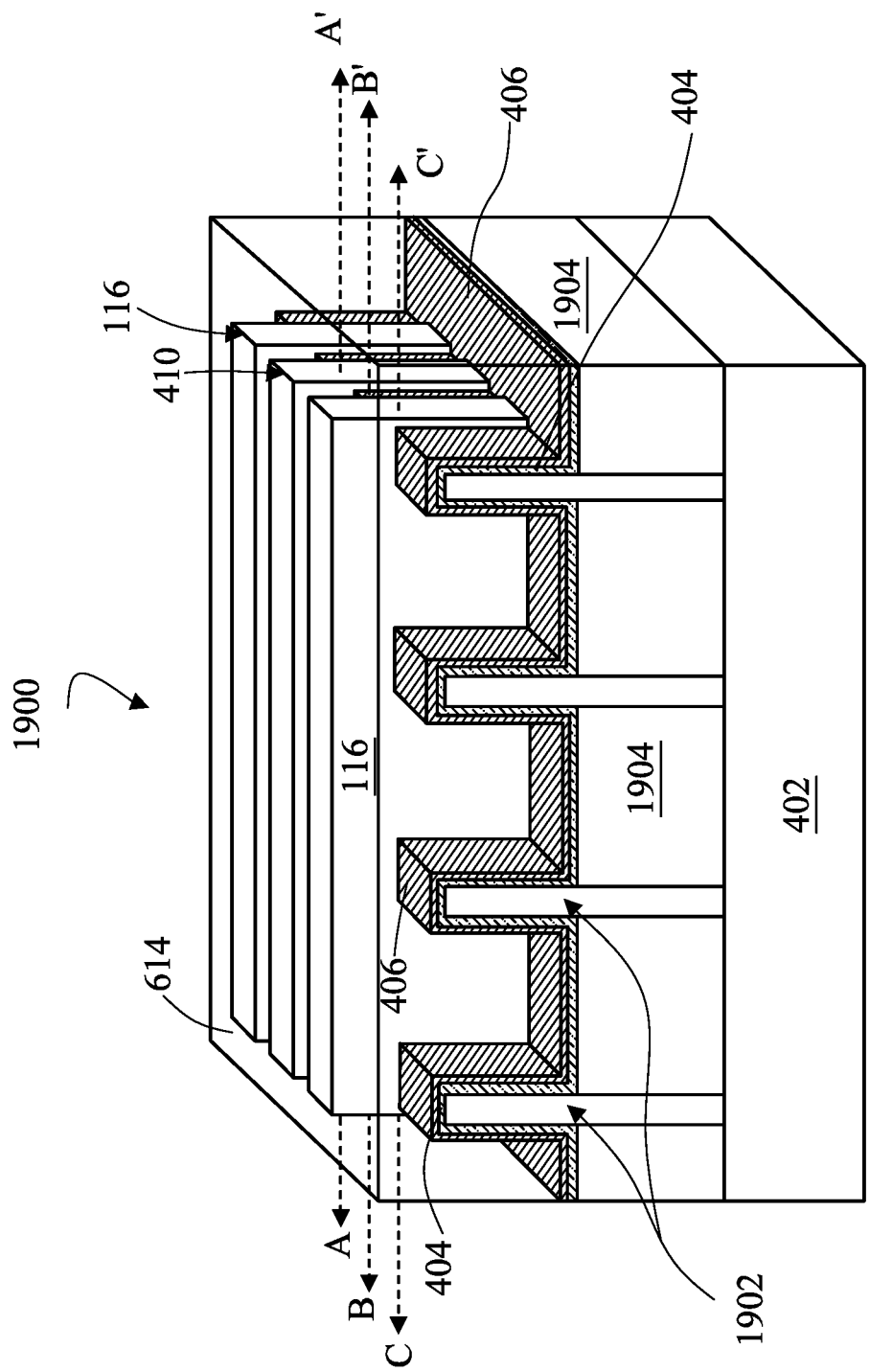
FIGS. 19A, 19B, 19C, and 19D provide perspective and cross-sectional views respectively of an embodiment of fin-type field effect transistors (finFETs) according to various aspects of the present disclosure.
Figure 19B:
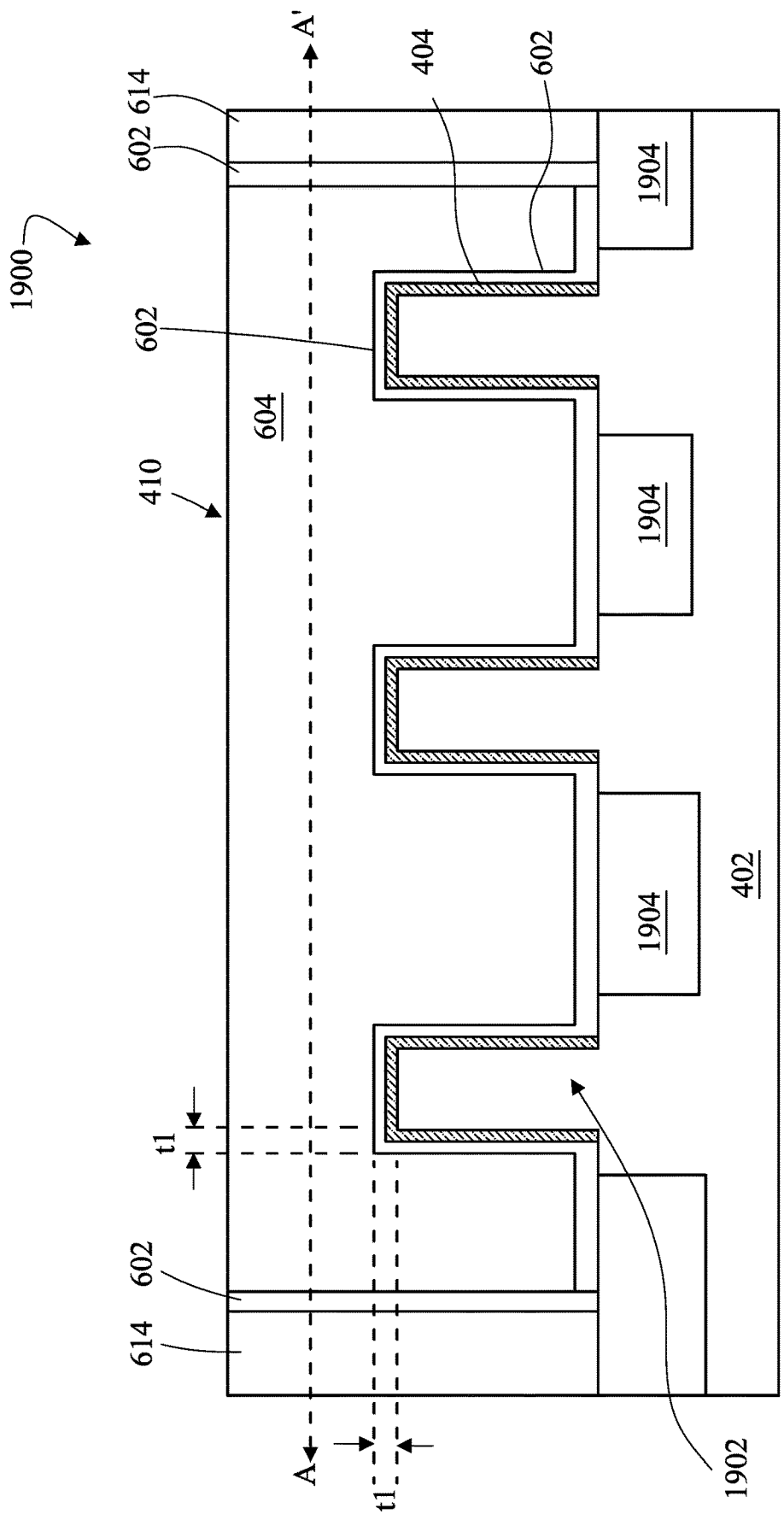
Figure 19C:
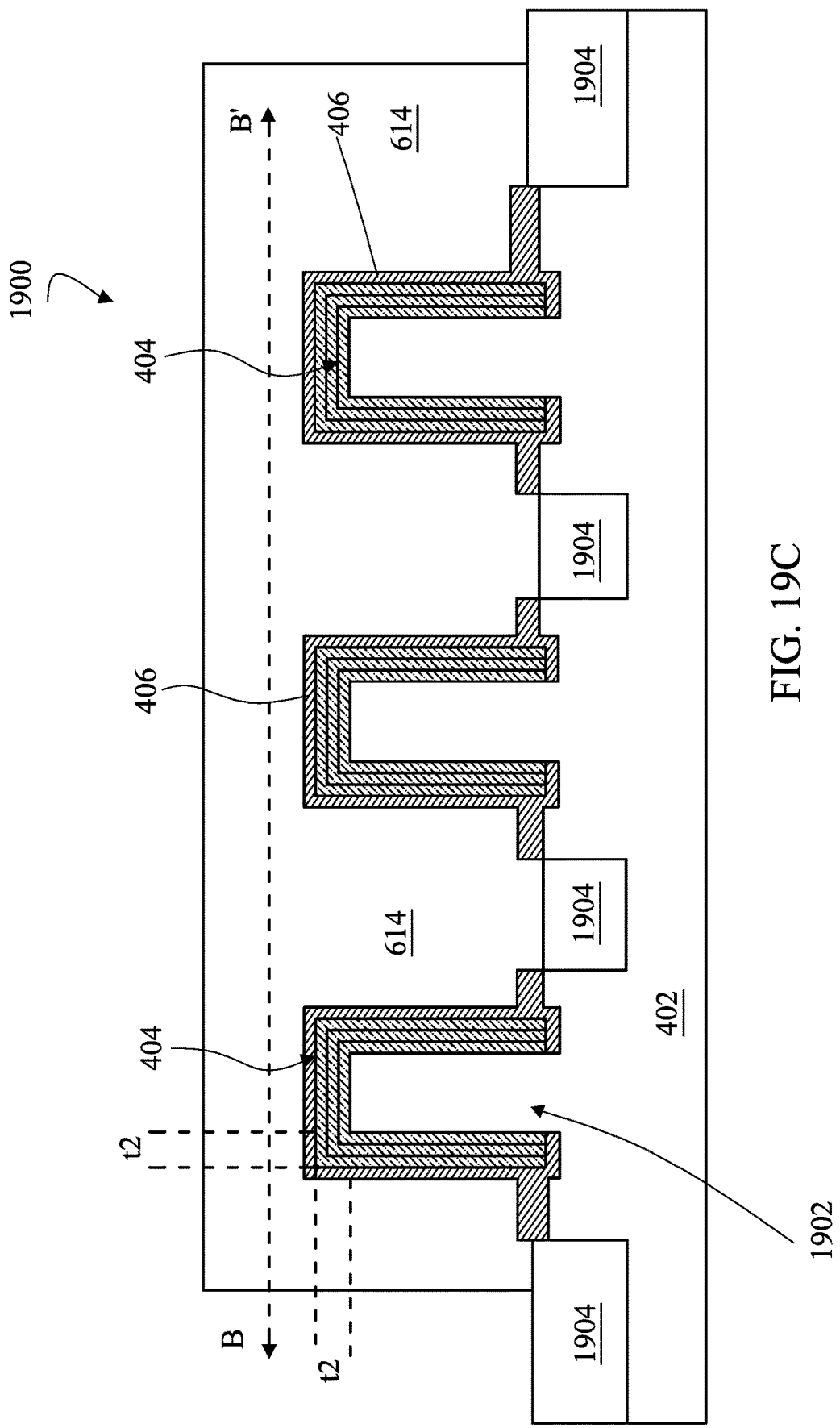
Figure 19D:
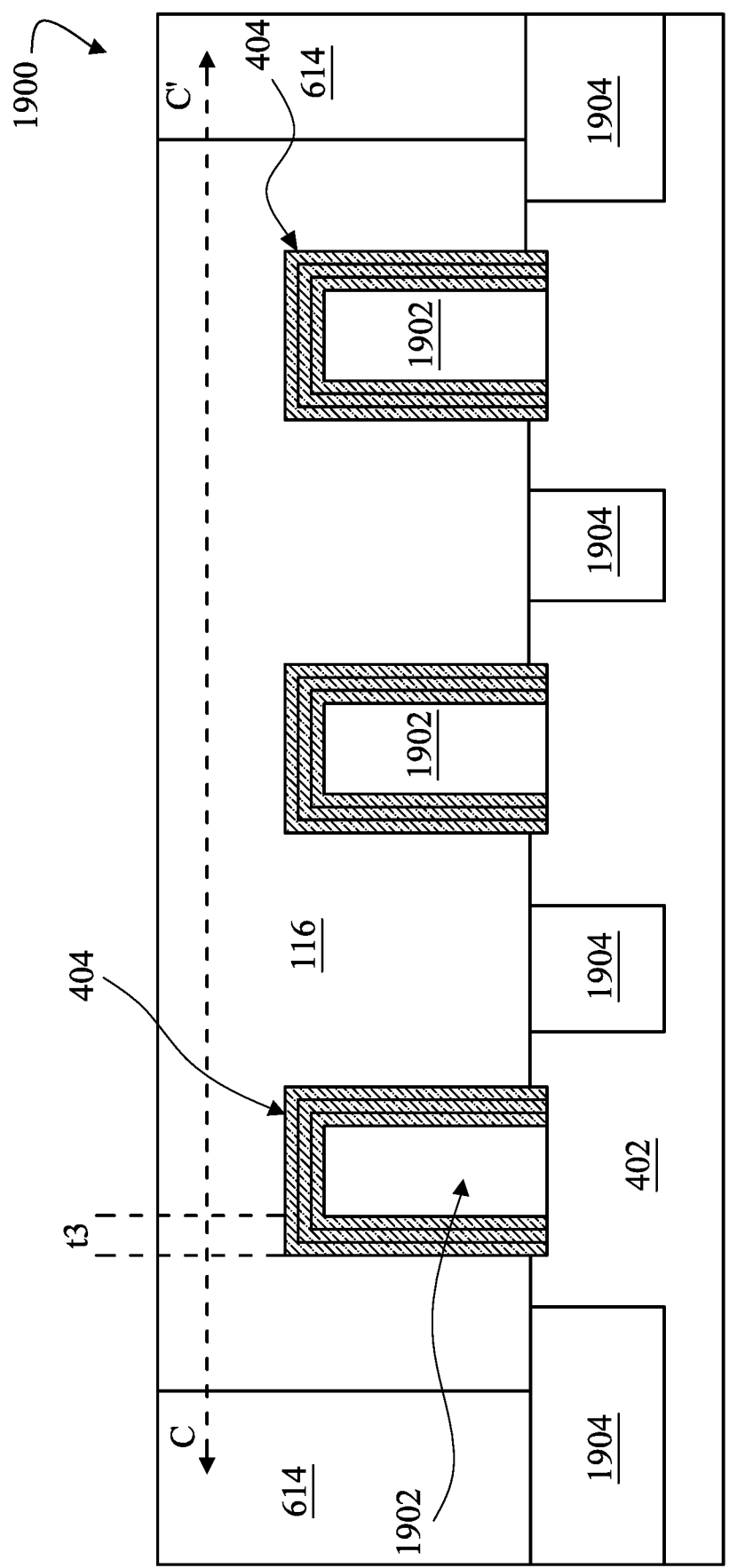

Referring to FIGS. 19A, 19B, 19C, and 19D collectively a device 1900 is provided. FIG. 19A illustrates a perspective view of the device 1900 which includes a fin-type field effect transistor or finFET. FIG. 19B illustrates cross-sectional view along the gate width direction in the channel region. FIG. 19D illustrates a cross-sectional view parallel the gate width direction through the contact landing region. FIG. 19C illustrates a cross-sectional view parallel the gate width direction between the gate structure and the contact (e.g., source/drain region between contact and the channel). As stated above, the device 1900 includes at least one fin-type field effect transistor or finFET. For example, the device 1900 forms a multi-gate device, the gate having an interface on at least one lateral sidewall of a channel region. Similar to the device 800, the device 1900 also includes a substrate 402, a BP layer 404 over the substrate 402, a passivation layer 406, a gate stack 410, source and drain (S/D) contacts 116. An ILD layer 614 may be disposed on the device 1900. The ILD layer 614 may be substantially similar to as discussed above. One of ordinary skill in the art would understand the ILD layer 614 to be disposed on the fin and the isolation features and between the fin structures, gate structure, and/or contact structures. One difference between the devices 800 and 1900 is that the substrate 402 of the device 1900 provides a non-planar surface on which the various features are formed. In the present embodiment, the non-planar insulating surface comprises a plurality of fins 1902. The fins 1902 are or include a dielectric material, such as silicon oxide. The dielectric material may form a top surface and sidewalls of the fins 1902. In an embodiment, the dielectric material is formed on a semiconductor material formed in a fin-shape. In an embodiment the entirety of the fin 1902 may be dielectric. In other embodiments, the fin 1902 may be a semiconductor material, such as silicon, silicon germanium, and/or other materials including semiconductor material upon which a dielectric material is disposed (e.g., underlying the BP layer 404). In some embodiments, isolation features 1904 interpose the fins 1902. The isolation features 1904 may be shallow trench isolation (STI) features formed of a dielectric material such as, for example, silicon oxide or other suitable insulator. In another embodiment, the fins 1902 may be formed on a dielectric substrate such as a substrate of silicon dioxide. In such an embodiment, the isolation features 1904 can be omitted.

The BP layer 404 and the passivation layer 406 are formed conformally over the fins 1902. The gate stack 410 interfaces with multiple surfaces of the BP layer 404 disposed on the fins 1902, thereby forming a multi-gate transistor. It is noted that passivation layer 406 covers portions of the BP layer 404, but may be omitted from certain locations illustrated in FIG. 19A, FIG. 14B in other embodiments; for example, omitted from being disposed on a top surface of the isolation features 1904. In an embodiment, there is no passivation layer above the isolation features 1904, for example, as the passivation layer 406 may be etched during the subsequent formation of the isolation features 1904.

Comparing FIGS. 19B, 19C, and 19D it is illustrative that the BP layer 404 has a thickness variation depending on the region of the BP layer. In an embodiment, the BP layer 404 has a thickness t1 in the channel region underlying the gate stack 410. In an embodiment, the BP layer 404 has a thickness t2 in the source/drain region. In an embodiment, the BP layer 404 has a thickness t3 interfacing the contact 412 (e.g., the contact landing region). t1, t2, t3 may be substantially similar to as discussed above with reference to FIGS. 3, 4, 5, and 6A/6B. In an embodiment, t1 is less than t2. In an embodiment, t3 is substantially equal to t2. In a further embodiment, t3 is less than t2. In some embodiments, t3 is greater than t1. Substantially similar to as discussed above with example to the planar transistor embodiment, in an embodiment during the formation of the BP layer 404 on the fin 1902 a first thickness is provided in the channel region (e.g., t1) and a second thickness is provided in the source/drain region (e.g., t2). During formation of the contact to the source/drain region, the BP layer 404 may be maintained to be equal that of the source/drain region (e.g., t2) or alternatively, may be reduced in thickness from that of the surrounding source/drain region (e.g., one or more monolayers removed in the contact landing region) during the opening of the contact region (e.g., through the ILD/passivation layers). In other words, the BP layer 404 may be reduced from thickness t2 to provide decreased thickness t3 at the contact 116 landing regions.

The ILD layer 614 is illustrated as being disposed over the BP layer 404 on the fin structures 1902. A single ILD layer 614 is illustrated for ease of reference; however, other layers may also and/or alternatively be disposed in this region including spacer elements formed adjacent (e.g., abutting) the gate structure, contact etch stop layer (CESL), and/or other suitable materials. In an embodiment, the CESL is deposited before making an opening for a contact element. Additionally, the passivation layer 406 may alternatively be removed from one or more surfaces of the BP layer 404 during fabrication of overlying layers.

While many different fabrication methods are possible and within the scope of the present disclosure, including those described above, it is noted that in an embodiment, the ILD layer(s) 614 are formed after which an opening is formed within which a gate 410 is formed (e.g., replacement gate process). Prior to forming the gate, the thickness of the BP layer 404 underlying the gate may be reduced (e.g., providing t1). Further, this or other fabrication methods may result in the BP layer 404 being offset a horizontal distance from an edge of an isolation feature 1904.

It is noted that any of the methods (e.g., FIGS. 3, 7, 10, 13) and/or features of devices illustrated in the Figures above (FIGS. 1-18) may also apply to the formation of a multi-gate FET such as illustrated in FIGS. 19A, 19B, 19C, 19D.

In various embodiments, each of the FETs 400, 800, 1100, 1400, 1500, 1800 and 1900 may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Different embodiments of the present disclosure can provide for different advantages. For example, passivation of the edges, strain application, increasing the sidewall thickness of the active region, and/or modifying the sidewall profile can provide for reducing the resistance of a contact formed to a source/drain region of the FET. For example, the edge states of the 2D material such as BP, can be passivated to provide metallic characteristics for contact landing. The strain application can increase conduction band minimum (CBM) while substantially maintaining valence band maximum (VBM).

Although not intended to be limiting, one or more embodiments of the present disclosure provide many benefits to a semiconductor device and the formation thereof. For example, embodiments of the present disclosure provide methods for manufacturing ultra-thin body transistors having a 2D material channel such as a black phosphorus (BP) channel. Some embodiments of the methods and devices provided herein provide for a reduced contact resistance to the source/drain region of the 2D material. Exemplary methods and devices to achieve reduction in contact resistance include increase in the sidewall length of the 2D material in the S/D region that interfaces with the contact, passivating of the sidewalls of the 2D material in the S/D region that interfaces with the contact such that a metallic nature of the edge is provided; applying a stress layer over the 2D active region; and/or providing a nonlinear sidewall to the edge region of the 2D material.

In one exemplary aspect, the present disclosure is directed to a field-effect transistor (FET). The FET includes a black phosphorus (BP) layer over a substrate. The BP layer includes a channel region, a source region, and a drain region. The BP has a first thickness in the channel region and a second thickness in the source/drain (S/D) region, where the first thickness is less than the second thickness. A contact is disposed over the FET and interfaces the BP layer having the second thickness.

In another exemplary aspect, the present disclosure is directed to a FET that provides for a 2D material layer with a channel region, a source region, and a drain region. The 2D material layer has a first thickness in the channel region and a second thickness in the source/drain (S/D) region, where the second thickness is greater than the first thickness. The 2D material layer in the S/D region has a sidewall. A contact is disposed over the FET and interfaces the sidewall of the 2D material layer. A gate electrode is disposed over the channel region. In some embodiments, the first sidewall has passivated edge. In some embodiments, the first sidewall is nonlinear. In some embodiments, the stress layer is disposed over the 2D material layer.

In another exemplary embodiment, there is device having a black phosphorous (BP) layer on a dielectric layer. A gate structure is disposed over a channel region of the BP layer. The channel region of the BP layer has a first thickness. A contact interfaces the BP layer over a source/drain region having a second thickness. The second thickness being different than the first thickness. A gate structure is disposed over the channel region.

In another exemplary aspect, the present disclosure is directed to a method of forming a field effect transistor (FET). The method includes forming a black phosphorus (BP) layer over a substrate to a first thickness in a first region and a second thickness in the second region. A gate structure is formed over the first region. A contact structure is deposited on the substrate interfacing a least a portion of the second region.

In another exemplary aspect, the present disclosure is directed to a method of forming a FET. The method includes forming a black phosphorous (BP) layer on a substrate, wherein the BP layer has a first edge and a second edge transverse to the first edge. The BP layer is exposed to a mixture of oxygen and at least one of sulfur and selenium. A least one of the sulfur and selenium is adsorbed at each of the first edge and the second edge. A contact is formed interfacing the first edge.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a field-effect transistor (FET), comprising:
    forming a 2D material layer having a first thickness over a substrate, the 2D material layer including a channel region and a source/drain region;
    etching the 2D material layer in the channel region to form the 2D material layer in the channel region having a second thickness, the second thickness being less than the first thickness;
    forming a gate structure over the channel region having the second thickness;
    forming a dielectric layer over the source/drain region of the 2D material layer; and
    forming a hole in the dielectric layer and exposing the 2D material layer.

2. The method of claim 1, wherein the forming the 2D material layer having the first thickness includes forming three monolayers of phosphorene.

3. The method of claim 2, wherein the etching the 2D material layer removes at least one monolayer of the three monolayers of phosphorene.

4. The method of claim 1, filling the hole with conductive material to form a contact.

5. The method of claim 4, wherein the conductive material interfaces a sidewall of the 2D material layer.

6. The method of claim 5, wherein the conductive material interface with the sidewall of the 2D material layer extends the second thickness.

7. The method of claim 1, wherein the forming the hole exposing the 2D material layer removes at least one monolayer of the 2D material layer to form the 2D material layer of a third thickness, the third thickness less than the second thickness.

8. The method of claim 1, further comprising:
a passivating an edge of the 2D material layer.

9. The method of claim 1, further comprising:
providing the substrate, wherein the substrate has a plurality of fins extending from the substrate, wherein the forming the 2D material layer having the first thickness over the plurality of fins.

10. A method of forming a device, the method comprising:
forming a black phosphorous (BP) layer on a dielectric layer, wherein the BP layer is a first thickness;
reducing the first thickness of the BP layer in a first region to a second thickness, while maintaining the first thickness in a second region;
forming a gate structure over the first region of the BP layer; and
forming a contact interfacing the BP layer over the second region.

11. The method of forming the device of claim 10, wherein the forming the contact includes reducing the first thickness to a third thickness.

12. The method of claim 11, wherein the forming the contact forms a conductive material interfacing the BP layer of the third thickness.

13. The method of claim 11, wherein a difference between the first thickness and the second thickness is 2 monolayers and wherein a difference between the first thickness and the third thickness is 1 monolayer.

14. The method of claim 10, further comprising: doping an edge of the BP layer with at least one of selenium or sulfur.

15. The method of claim 10, wherein the forming the gate structure includes depositing a gate dielectric layer of the gate structure interfacing the BP layer having the second thickness.

16. The method of claim 10, wherein the reducing the first thickness includes etching a monolayer of the BP layer.

17. A method of fabricating a field effect transistor (FET), comprising:
forming a black phosphorous (BP) layer on a substrate, wherein the BP layer has a first edge and a second edge transverse to the first edge;
removing at least one layer of the BP layer in a channel region;
forming a gate structure over the channel region;
passivating the first edge; and
forming a contact interfacing the passivated first edge.

18. The method of claim 17, wherein the passivating includes doping the BL layer.

19. The method of claim 18, wherein the doping the BL layer includes exposing the BP layer to a mixture of oxygen, sulfur and selenium.

20. The method of claim 17, wherein the forming the BP layer includes forming the first edge being non-linear.

* * * * *